United States Patent
Pyeon et al.

(10) Patent No.: US 6,392,456 B1
(45) Date of Patent: May 21, 2002

(54) ANALOG MIXED DIGITAL DLL

(75) Inventors: Hong Beom Pyeon, Choongcheongbuk-Do; Kyung Hoon Chang; Ju Han Kim, both of Kyungki-Do, all of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/427,272

(22) Filed: Oct. 26, 1999

(30) Foreign Application Priority Data

Jan. 12, 1999 (KR) ................................................ 99/565

(51) Int. Cl.[7] ................................................ H03L 7/06
(52) U.S. Cl. ..................... 327/156; 327/147; 327/153; 327/162; 375/376; 331/DIG. 2; 365/233
(58) Field of Search ........................ 327/146, 147–150, 327/153, 155–158, 161, 162, 269, 159; 375/373–376; 365/194, 233, 233.5; 331/11, 12, 25, DIG. 2, 1 A

(56) References Cited

U.S. PATENT DOCUMENTS 6,011,732 A * 1/2000 Harrison et al. ............ 365/194
6,087,868 A * 7/2000 Millar ......................... 327/156

* cited by examiner

Primary Examiner—Terry D. Cunningham
Assistant Examiner—Minh Nguyen
(74) Attorney, Agent, or Firm—Fleshner & Kim, LLP

(57) ABSTRACT

An analog mixed digital DLL includes a digital mode controller and an analog mode controller. The digital mode controller compares phases of delay clock signals outputted from a plurality of delay blocks and a first clock signal, detects an initial locking point, selects one delay clock signal at the detected initial locking point and controls the operation of the delay clocks. The analog mode controller compares the phase of the delay clock signal selected by the digital mode controller and the phase of a first clock signal. The analog mixed digital DLL can provide an externally inputted first control voltage or a second control voltage to the delay blocks in accordance with the digital and analog operation modes and implements a wide band frequency operation, has a short duration of jitters, prevents a multi-locking during a wide band frequency operation and decreases a current consumption.

74 Claims, 15 Drawing Sheets

ANALOG MIXED DIGITAL DLL

BACKGROUND OF THE INVENTION

1. Field of the Invention

The present invention relates to a Delay Locked Loop (DLL), and in particular, to an analog mixed digital DLL.

2. Background of the Related Art

As the technology of a semiconductor memory device is advanced, memory chips are designed to operate at a high speed. An internal clock signal CLKint used for the memory chips is obtained by delaying an external clock signal CLKext for a predetermined time. Since there is a certain limit for delaying the external clock signal, in order to decrease the time delay between an external clock signal CLKext and an internal clock signal CLKint, the Phase Locked Loop (PLL) or Delay Locked Loop (DLL) is generally used.

FIG. 1 is a block diagram illustrating a related art analog mixed digital DLL that includes an input buffer 10, a digital delay unit 20, and an analog delay unit 30. The input buffer 10 buffers the external clock signal CLKext and outputs the input clock signal CLKin. The digital delay unit 20 sequentially delays a input clock signal CLKin and outputs delay clock signals CLKD1–CLKD3. The digital delay unit 20 further selects single delay clock signal CLK2 locked to the input clock signal CLKin among the delay clock signals CLKD1–CLKD3. The analog delay unit 30 performs an analog locking operation with respect to the selected delay clock signal CLK2 selected by the digital delay unit 20.

The digital delay unit 20 includes variable delay units 21–23 for sequentially delaying the input clock signal CLKin, a multiplexer 24 for sequentially comparing the input clock signal CLKin and the delay clock signals CLKD1–CLKD3 from the variable delay units 21–23 and outputting one delay clock signal CLK2 locked to the input clock signal CLKin, and a replica delay unit 25 for delaying the locked clock signal CLK2 by a duration tAC of the delay of the replica (not shown) and outputting the delay locked clock signal CLK2' to the analog delay unit 30. Here, the variable delay units 21–23 are referred to as a voltage controlled delay unit that varies the delay ratios in accordance with a control voltage CV from the analog delay unit 30. The number of the variable delay units 21–23 is also variable.

The analog delay unit 30 includes a phase detector 31 for comparing the phase of the input clock signal CLKin and that of a delay clock signal CLK2' from the digital delay unit 20 and outputting the pulse signals UP and DN, a charge pump 32 and a voltage controller 33. The charge pump 30 performs a pumping operation in accordance with the pulse signals UP and DN from the phase detector 31, and the voltage controller 33 outputs a control voltage CV for controlling the delay ratios of the variable delay units 21–23 in accordance with an output from the charge pump 32. The phase detector 31 is edge-triggered and can be implemented by an Exclusive OR-gate (XOR), a JK flip-flop and Phase Frequency Detector (PFD).

The operation of the related art analog mixed digital DLL will now be described. The input buffer 10 generates an input clock signal CLKin by buffering an external clock signal CLKext, and the generated input clock signal CLKin is inputted into the digital delay unit 20 and the analog delay unit 30, respectively. The variable delay units 21–23 of the digital delay unit 20 sequentially delay the input clock signal CLKin and output a plurality of delay clock signals CLKD1–CLKD3. The multiplexer 24 sequentially compares the delay clock signals CLKD1–CLKD3 and the input clock signal CLKin and searches for a locking point. The locking point is determined as a point in which the phase of the delay clock signal CLK2 is slower than that of the input clock signal CLKin based on the duration tAC of the delay of the replica.

For example, assuming that the delay clock signal CLKD2 is locked to the input clock signal CLKin, the locked delay clock signal CLK2 is delayed by the duration tAC of the delay of the replica by the replica delay unit 25, and the phase detector 31 of the analog delay unit 30 compares the phase of the input clock signal CLKin and that of the delay clock signal CLKD2' from the replica delay unit 25. As a result of the comparison, if the phase of the delay clock signal CLKD2' leads the input clock signal CLKin, the phase detector 31 generates the pulse signal DN having a prescribed width wider than the width of the pulse signal UP. If the phase of the delay clock signal CLKD2' lags the input clock signal CLKin, the phase detector 31 generates the pulse signal DN having a predetermined width smaller than the width of the pulse signal UP.

If the width of the pulse signal DN is greater than that of the pulse signal UP, the driving capacity of the charge pump 32 is enhanced by the pulse signal DN so that the level of the control voltage from the voltage controller 33 is increased, and the duration of the delay of the variable delay units 21–23 is increased. If the width of the pulse signal UP is greater than that of the pulse signal DN, the driving capacity of the charge pump 32 is deteriorated by the pulse signal DN, and the level of the control voltage CV from the voltage controller 33 is decreased. In this case, the duration of the delay of the variable delay units 21–23 is decreased.

As the above-described processed are repeatedly performed, when the phases of the input clock signal CLKin and the delay clock signal CLKD2' become identical, the widths of the pulse signals DN and LP from the phase detector 31 also become identical, so that the output from the charge pump 32 becomes a stable state. This state becomes the final locking state of the analog delay unit 30, and the locking clock signal CLK2 from the multiplexer 24 becomes the final internal clock signal CLKin.

The related art analog mixed digital DLL selects one delay clock signal of the delay clock signals CLKD1–CLKD3 locked to the input clock signal CLKin through the digital delay unit 20, and the analog delay unit 30 finally performs an detailed analog locking operation with respect to the selected delay clock signal CLKD1–CLKD3.

As described above, the related art analog mixed digital DLL has various disadvantages. In the related art analog mixed digital DLL, the multiplexer receives the delay clock signals from the variable delay units and compares the received delay clock signals and the input clock signal based on a 1:1 comparison. In this case, it takes long time to generate the final internal clock signal, and a data access time of the memory apparatus that uses the internal clock signals is increased.

In addition, to operate the related art analog mixed digital DLL in a band frequency range, a number of the variable delay units should be increased because the locking occurs in a front variable delay unit of the analog mixed digital DLL in the case of the low frequency, and the locking occurs in a rear variable delay unit of the analog mixed digital DLL in the case of the high frequency. Therefore, the number of the variable delay units should be increased when operating the analog mixed digital DLL in the wide band frequency range of the external clock signal. However, the jitter characteristic is degraded when the related art analog mixed digital DLL is operated in the high frequency region because of the variation of the operation voltage, the external noise and the temperature increase, so that multi-locking (a plurality of locking points) occurs. The multiple locking clock signals, which are generated by the multi-locking, theoretically have the same timing but have a prescribed timing difference. The clock timing of the final internal clock signals, which are outputted through the output buffer (not shown), may be changed based on the prescribed timing difference. In addition, the related analog mixed digital DLL increases the current consumption since the variable delay units after the locked variable delay unit are unnecessarily operated.

The above references are incorporated by reference herein where appropriate for appropriate teachings of additional or alternative details, features and/or technical background.

SUMMARY OF THE INVENTION

An object of the present invention is to provide an analog mixed digital DLL that substantially overcomes one or more problems caused by disadvantages of the related art.

Another object of the present invention is to provide an analog mixed digital DLL that implements a wide band frequency operation and reduces jitters.

Another object of the present invention is to provide an analog mixed digital DLL, which has a noise immunity.

Another object of the present invention is to provide an analog mixed digital DLL that prevents a multi-locking in the wide band frequency operation.

Another object of the present invention is to provide an analog mixed digital DLL that generates an internal clock signal from an external clock signal within a short time.

Another object of the present inventions is to provide an analog used digital DLL that decreases current consumption.

To achieve at least the above objects in a whole or in parts, there is provided an analog mixed digital DLL according to in the present invention that includes an input buffer for buffering an external clock signal and outputting a first clock signal, a digital mode controller for comparing the phases of delay clock signals outputted from a plurality of delay blocks and a first clock signal, detecting an initial locking point, selecting one delay clock signal at the detected locking point and controlling the operation of the delay clocks, an analog mode controller for comparing the phase of the delay clock signal selected by the digital mode controller and the phase of the first clock signal, and a control voltage conversion switch for providing the externally inputted first control voltage or the second control voltage to the delay blocks in accordance with the digital and analog operation modes.

To further achieve the above objects, there is provided an analog mixed digital DLL according to the present invention that includes an input buffer for buffering an external clock signal and outputting a first clock signal, an analog mode controller for comparing the phases of a DLL-locked delay clock signal and a first clock signal and outputting a first voltage, a replica moving switch for moving the position of a replica, a control voltage conversion switch for switching first and second control voltages in accordance with the digital and analog operation modes, a delay block array formed of a plurality of delay blocks for varying the delay duration by the first and second control voltages for sequentially delaying the first clock signal, a multiplexer controller for comparing the phases of the delay clock signals from the delay block array and the first clock signal, outputting a locking signal, and outputting a control signal for controlling the path of the delay clock signals, a selection signal generator for receiving the control signal and outputting a selection signal, and a multiplexer for outputting one delay clock signal selected by the selection signal to the analog mode controller and outputting an enable signal for receiving a control signal from the multiplexer controller and controlling the delay blocks.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
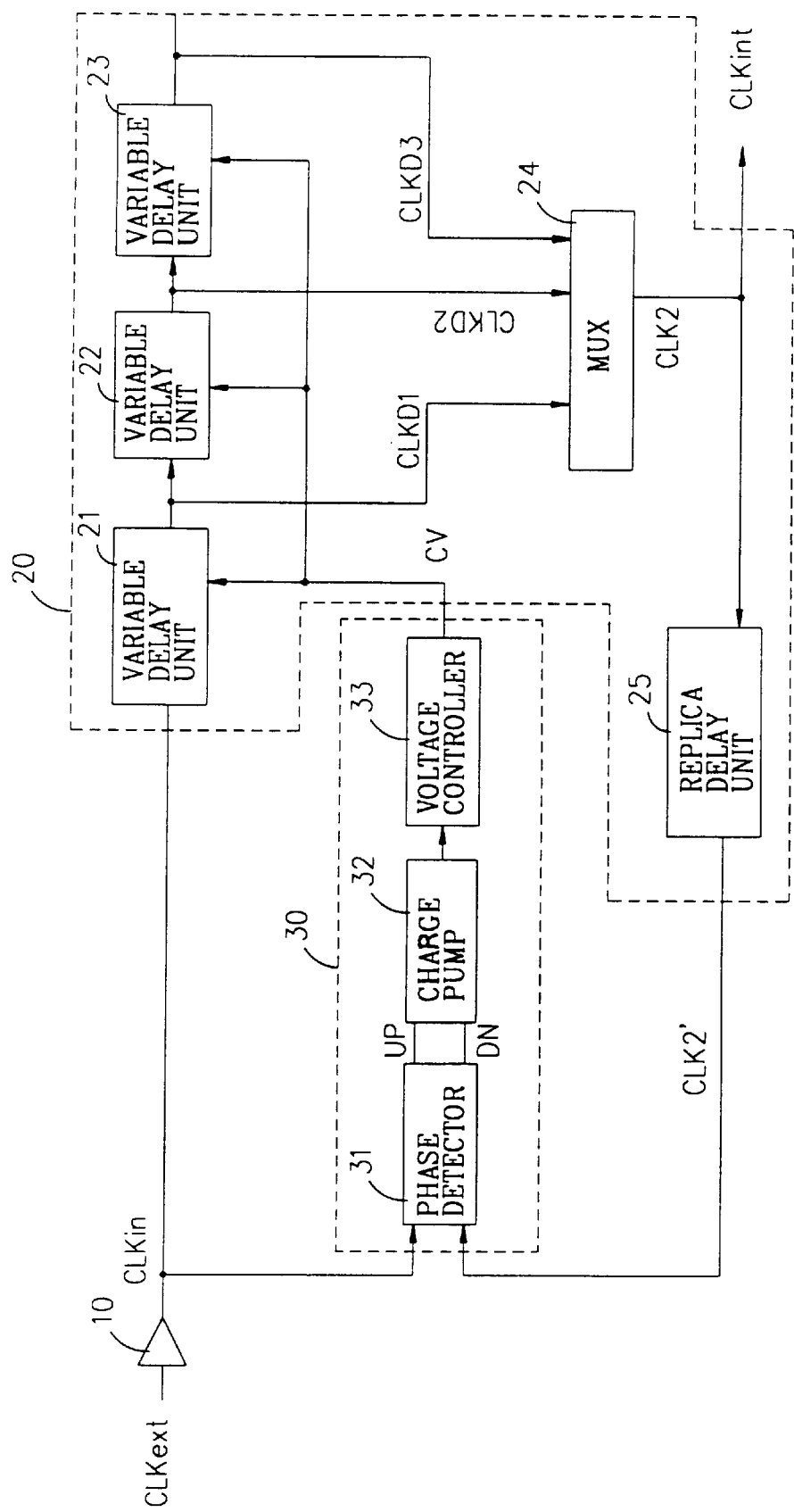
FIG. 1 is a block diagram illustrating a related art analog mixed digital DLL.
Figure 2:
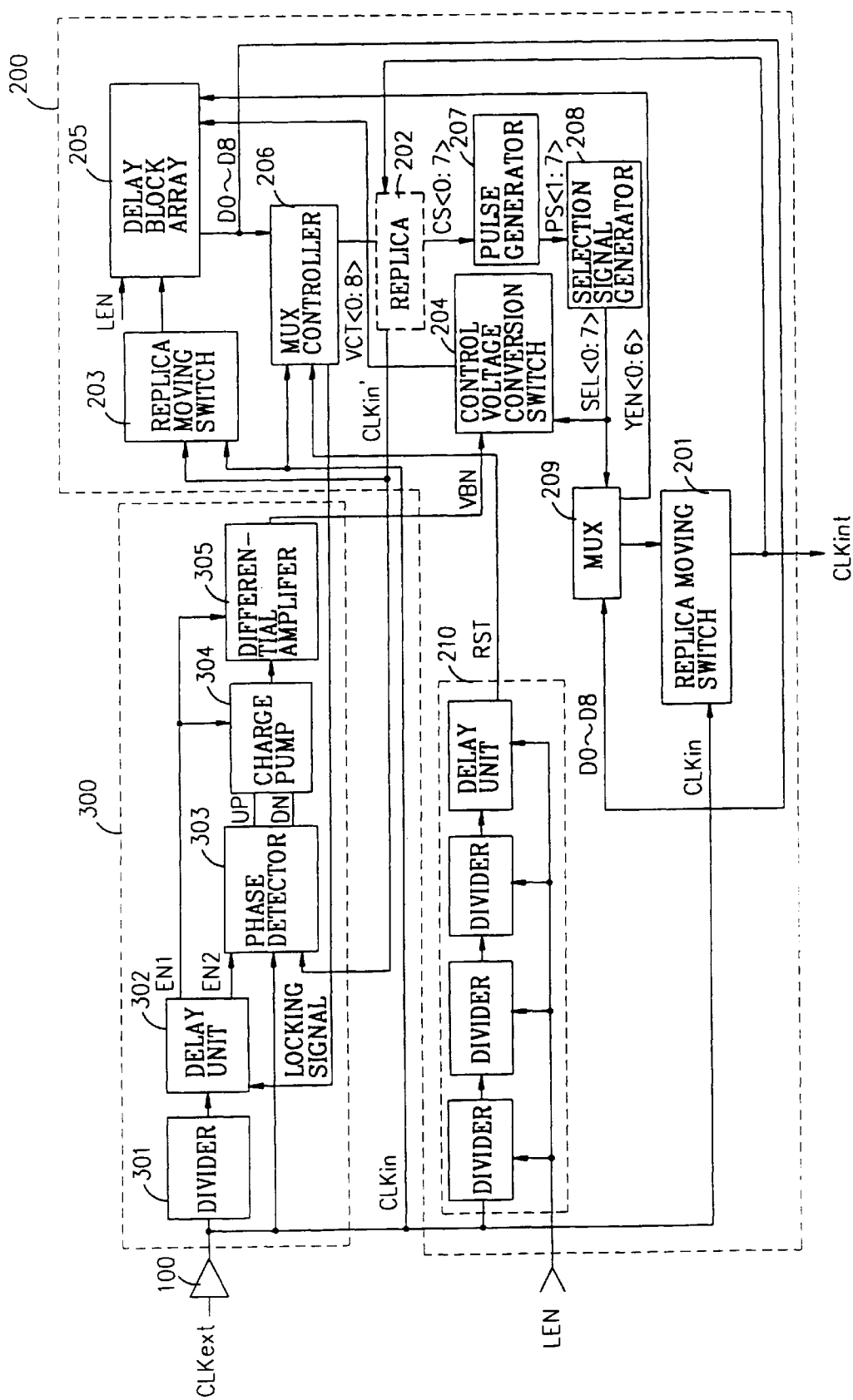
FIG. 2 is a block diagram illustrating a preferred embodiment of an analog mixed digital DLL according to the present invention.

As shown in FIG. 2, an analog mixed digital DLL according to a first preferred embodiment of the present invention includes an input buffer 100, a digital mode controller 200, and an analog mode controller 300. The input buffer 100 buffers an external clock signal CLKext and outputs an input clock signal CLKin to the digital mode controller 200 and the analog mode controller 300.

The digital mode controller 200 respectively compares the phases of a plurality of clock signals D0–D8, which are delayed more than one cycle, and the input lock signal CLKin for detecting an initial locking point, and selects one delay clock signal D locked to the input clock signal CLKin and having a phase that lags the input clock signal CLKin at the detected initial locking point. The analog mode controller 300 receives the delay clock signal D selected from the digital mode controller 200 and performs a detailed tuning operation to match the phase of the delay clock signal D and the phase of the input clock signal CLKin.

The digital mode controller 200 includes replica moving switches 201 and 203, a replica 202, a control voltage conversion switch 204, a delay block array 205, a multiplexer controller 206, a pulse signal generator 207, a selection signal generator 208 and a multiplexer 209. The replica moving switches 201 and 203 moves the position of the replica in accordance with the digital operation mode and analog operation mode. In the digital operation mode, the replica 202 is positioned in the front stage of the delay block array 205, and in the analog mode after the digital locking is performed, the replica 202 is positioned in the rear stage of the multiplexer 209.

The control voltage conversion switch 204 outputs a control voltage VCT of the VCC~Vtp level outputted from the initial control voltage generator (not shown) to the delay block array 205 in the initial digital operation mode. The control voltage conversion switch 204 also outputs the control voltage VCT of a predetermined level outputted from the analog mode controller 300 to the delay block array 205 in the analog mode after the digital locking is performed.

Figure 3:
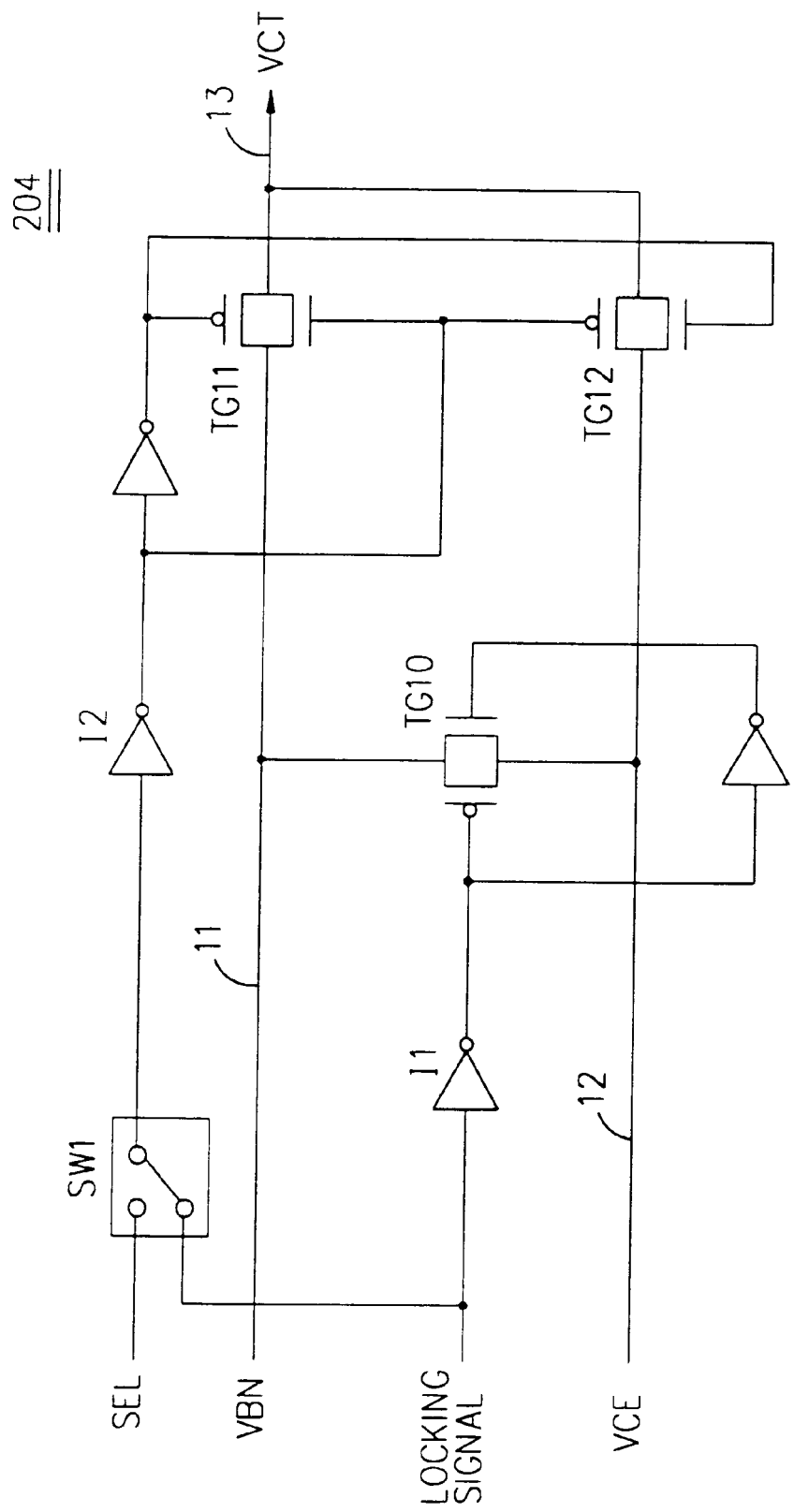
FIG. 3 is a circuit diagram illustrating an exemplary embodiment of a control voltage converting switch of FIG. 2.

FIG. 3 illustrates an exemplary embodiment of the control voltage conversion switch 204. As shown in FIG. 3, the control voltage conversion switch 204 includes an inverter I1 for inverting a locking signal, a switch SW1 for switching a selection signal SEL or a locking signal, and an inverter I2 for inverting an output from the switch SW1. A transmission gate TG10 is for electrically the coupling input lines 11 and 12 of the voltages VBN and VCE in accordance with an output of the inverter I1, and transmission gates TG11 and TG12 output the voltages VBN and VCE to the output line 13 in accordance with an output of the inverter I2. The switch SW1 is preferably implemented based on a metal option.

Figure 4:
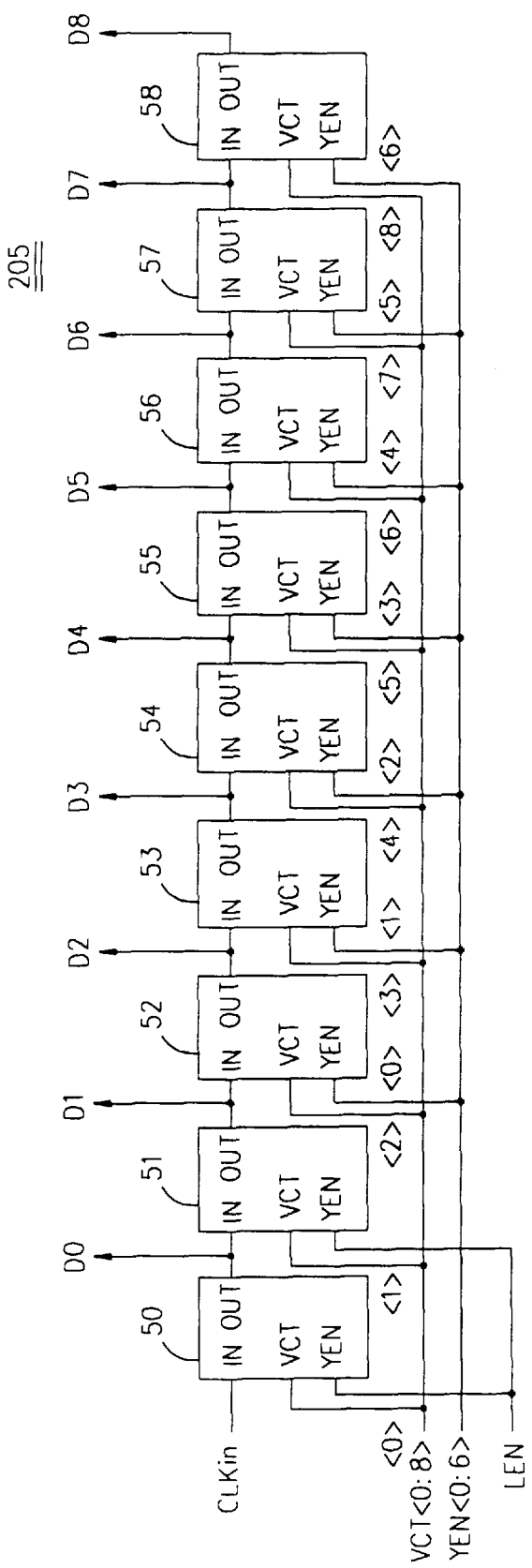
FIG. 4 is a block diagram illustrating an exemplary delay block array of FIG. 2.

As shown in FIG. 4, an exemplary embodiment of the delay block array 205 includes a plurality of delay blocks 50–58 and is a block that sequentially delays the input clock signal CLKin in accordance with the control voltage VCT and outputs a plurality of delay clock signals D0–D8. The delay blocks 50–51 are always operated by the DLL enable signal LEN, and the delay blocks 52–58 are converted between the enable/disable mode according to an a delay block enable signal YEN.

Figure 5:
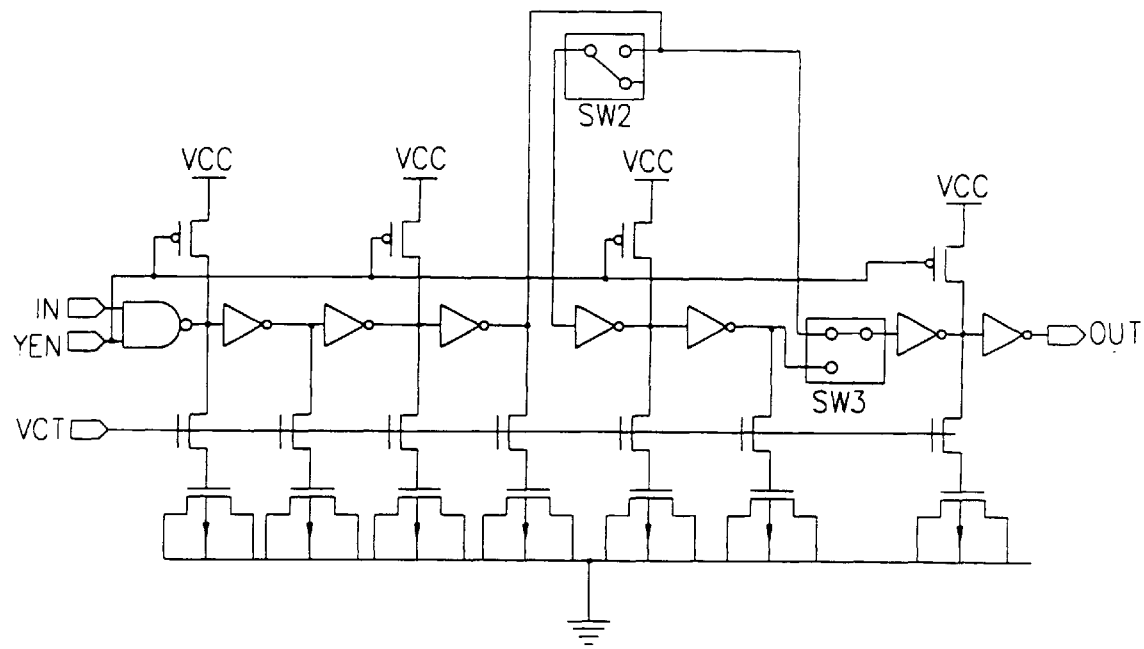
FIG. 5 is a circuit diagram illustrating an exemplary delay block of FIG. 4.

FIG. 5 illustrates an exemplary detailed circuit of one of the delay blocks 50–58. The switches SW2 and SW3 vary the number of series coupled inverters and may be implemented by the metal option process that controls the variation based on the process variables. In addition, a NMOS transistor and a capacitor (FET) are preferably coupled in series between the input/output contacts of the inverters and ground. Since the turn-on state of the NMOS transistors are controlled by the level of a control voltage VCT, the load of the capacitor is varied by the turn-on state of the NMOS transistor and the duration of the delay of each inverter is controlled by the load of the capacitor. Therefore, the duration of the delay of each inverter may be controlled by the control voltage VCT. For stability in an initial operation, a setting PMOS transistor is preferably coupled between the power supply voltage VCC and each of the output terminals of the odd numbered inverters in the series coupled inverters.

The multiplexer controller 206 compares the input clock signal CLKin and the delay clock signal D0–D8 outputted from the delay block array 205 for detecting a locking point. The multiplexer controller 206 outputs control signals CS0–CS7 for selecting one delay clock signal D locked to the input clock signal CLKin at the detected locking point.

Figure 9:
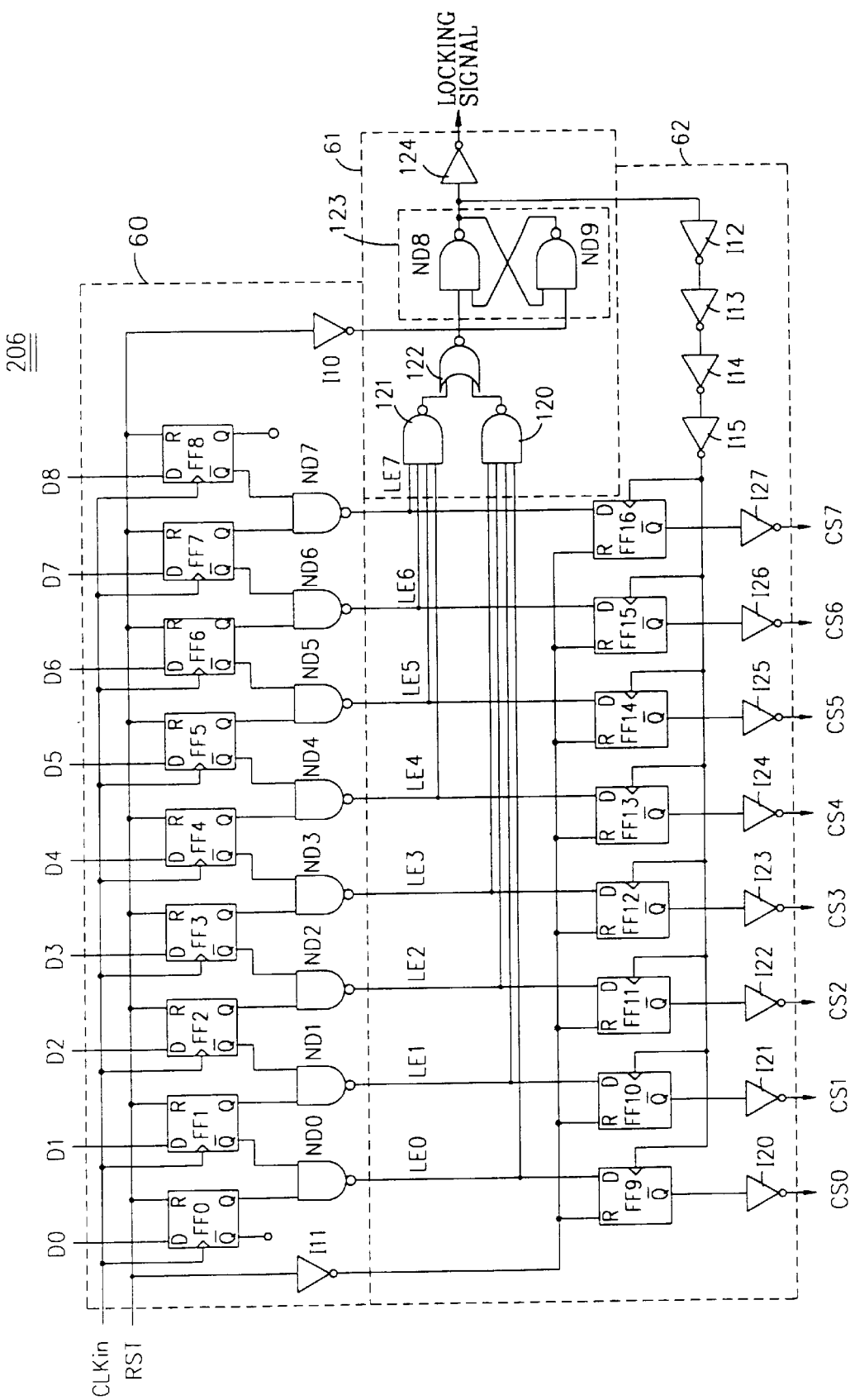
FIG. 9 is a circuit diagram illustrating an exemplary embodiment of a multiplexer controller of FIG. 2.

FIG. 9 is a circuit diagram illustrating an exemplary embodiment of the multiplexer controller 206. As shown in FIG. 9, a locking point detector 60 samples a plurality of delay clock signals D0–D8 at the rising edge of the input clock signal CLKin, logically computes the sampled values and outputs locking enable signals LE0–LE7. According to the first preferred embodiment of the analog mixed digital DLL the present invention, the locking point detector 60 includes a plurality of master slave flip-flops FF0–FF8 and a plurality of NAND-gates ND0–ND7. The NAND-gates ND0–ND7 sequentially NANDing the non-inverted output Q and inverted output /Q of each of the flip-flops FF0–FF8 and output locking enable signals LE0–LE7 of a low level when the locking point is detected.

A latch unit 61 of the multiplexer controller 206 latches the initial locking point to prevent the change of the input clock signal CLKin based on the internal voltage, temperature, etc. and performs a role that the selected delay clock signal D is not changed even when the locking point is changed. The latch unit 61 includes a NAND-gate 120 for NANDing the locking enable signals LE0–LE3 from the NAND-gates ND0–ND3, a NAND-gate 121 for NANDing the locking enable signals LE4–LE7 from the NAND-gates ND4–ND7, and a NOR-gate 122 for NORing the outputs from the NAND-gates 120 and 121. A SR latch 123 includes NAND-gates ND8 and ND9 for latching the output of the NOR-gate 122 in accordance with the reset signal RST inverted by the inverter I10, and an inverter 124 for inverting the output from the SR latch 123 and outputting the locking signal.

The control signal output unit 62 in the multiplexer controller 206 outputs control signals CS0–CS7 for selecting the locked delay clock signal D in accordance with the locking enable signals LE0–LE7 outputted from the locking point detector 60. The control signal output unit 62 includes inverters I12–I15 for sequentially delaying the output of the SR latch 123 and generating a pulse signal, and a plurality of flip-flops FF9–FF16 for inverting the locking enable signals LE0–LE7 from the locking point detector 60 in accordance with a pulse signal from the inverter I15. A plurality of inverters I20–I27 respectively invert the outputs from the flip-flops FF9–FF16 and output control signals CS0–CS7 of the DC level.

The pulse signal generator 207 preferably receives the control signals CS 1–CS7 of the DC level from the multiplexer controller 206 and generates pulse signals PS1–PS7 each having a predetermined width.

Figure 10:
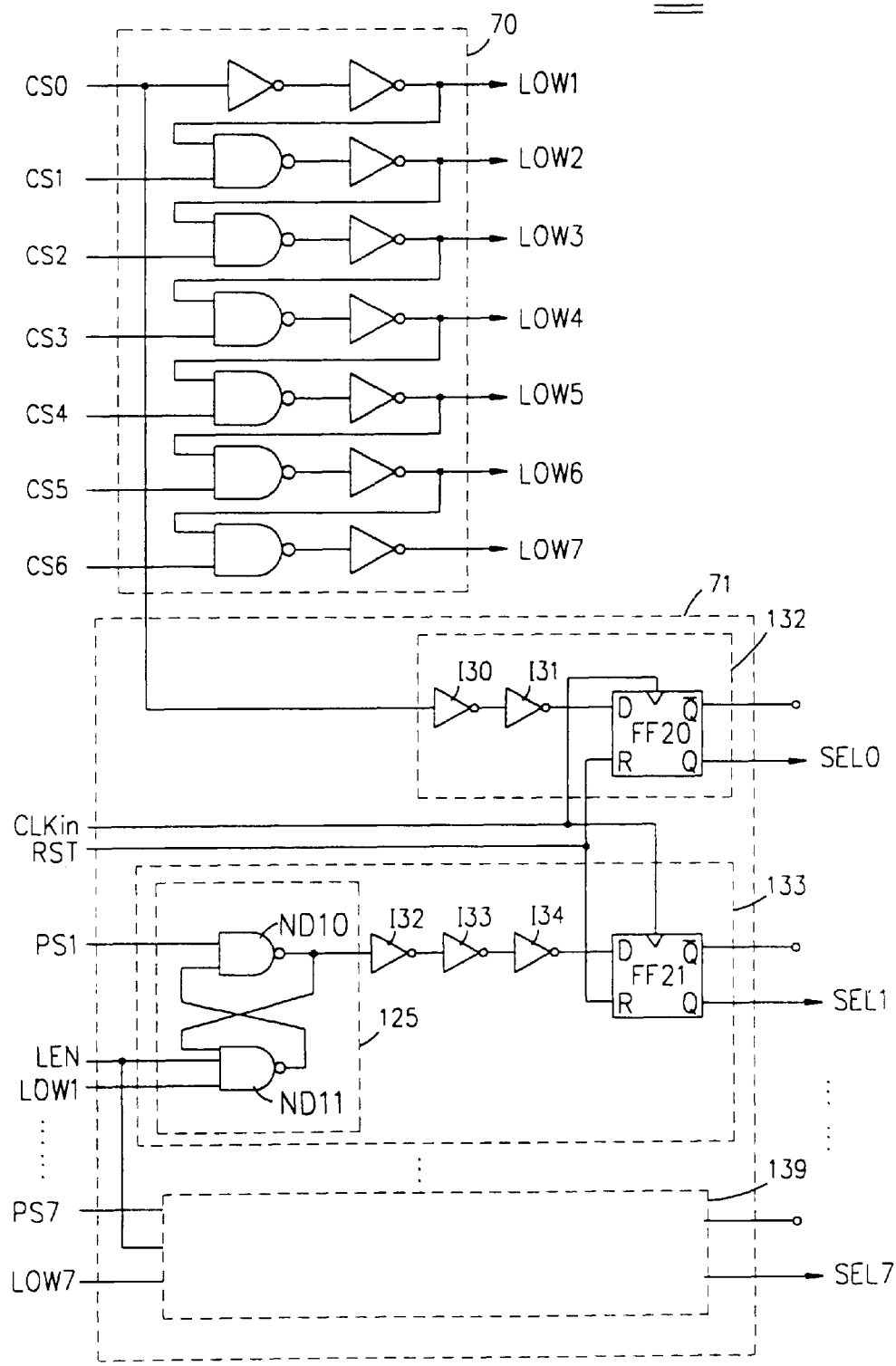
FIG. 10 is a circuit diagram illustrating an exemplary embodiment of a selection signal generator of FIG. 2.

The selection signal generator 208 receives the control signals CS0–CS6 and pulse signals PS1–PS7 from the multiplexer controller 206 and the pulse signal generator 207, respectively, and outputs selection signals SEL0–SEL7 for selecting the locked delay clock signal D. As shown in FIG. 10, the exemplary selection signal generator 208 includes a logic operation unit 70 for sequentially operating the control signals CS0–CS6 and generating output signals LOW1–LOW7, and a selection signal generator unit 71 for receiving the output signal LOW1–LOW7 and pulse signals PS1–PS7 from the logic operation unit 70 and the pulse signal generator 207, respectively, and generating the selection signals SEL0 through SEL7.

The logic operation unit 70 is preferably a logic AND-gate array where a NAND-gate and an inverter perform a function of the AND-gate. However, the present invention is not intended to be so limited. For example, the first inverter of the first stage may be changed with the NAND-gate having an input terminal receiving a power supply voltage VDD and another input terminal receiving a control signal CS0. The logic array is formed of seven stages, and the output signal LOW of each stage becomes one input of the next stage.

The selection signal generator unit 71 includes first through seventh selection signals generators 132–139 for outputting selection signals SEL0–SEL7, respectively. The first selection signal generator 132 includes inverters I30 and I31 for sequentially inverting the control signal CS0, and a flip-flop FF20 for outputting the output of the inverter 117. The second through seventh selection signal generators 133–139 each preferably include a SR latch 125 having NAND-gates ND10 and ND11, and inverters I32–I34 for sequentially inverting the output from the SR latch 125, and a flip-flop FF21 for outputting a non-inverted output of the inverter I34.

Figure 11:
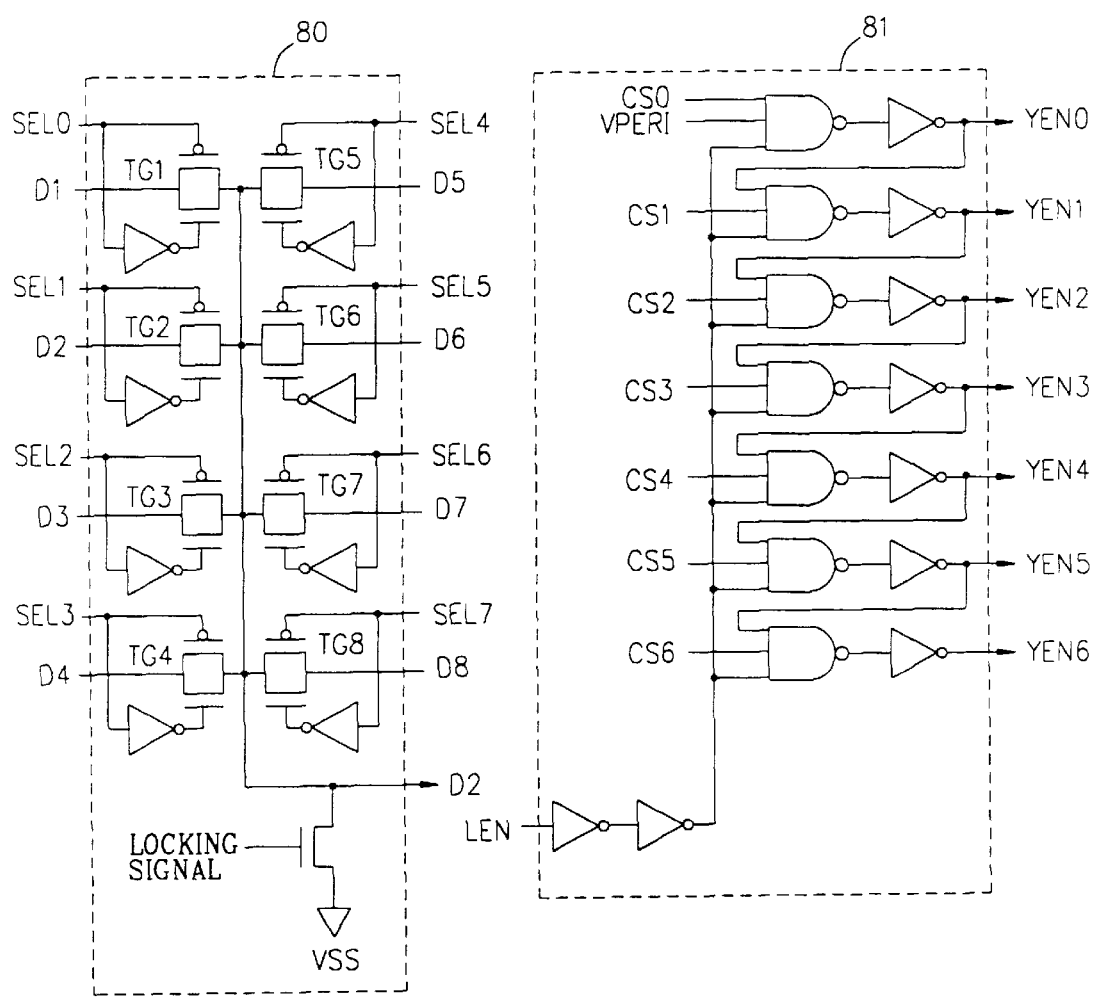
FIG. 11 is a circuit diagram illustrating an exemplary embodiment of a multiplexer of FIG. 2.

FIG. 11 illustrates an exemplary preferable embodiment of the multiplexer 209. The multiplexer 209 selects and outputs to the replica 203 one delay clock signal D locked to the input clock signal CLKin among the delay clock signals D0–D8. Also, the multiplexer 209 logically operates the control signals CS0–CS6 from the multiplexer controller 206 and outputs delay block enable signals YEN0–YEN6 for disabling the delay block or blocks after the locked delay block. As shown in FIG. 11, the multiplexer 209 includes a multiplexer 80 for outputting one delay clock signal D in accordance with the selection signals SEL0–SEL7 from the selection signal generator 208, and a delay block array controller 81 for logically operating the control signals CS0–CS6 from the multiplexer controller 206 and generating the delay block enable signals YEN0–YEN6.

The multiplexer 80 includes transmission gates TG1–TG8 having a common output terminal for transmitting one of the delay clock signals D1–D8 in accordance with the selection signals SEL0–SEL7, and a NMOS transistor coupled in parallel with the common output terminal. The delay block array controller 81 is an AND-gate array, which is formed of 7 stages, and the enable signal YEN outputted from each stage is inputted into one input of the next stage. In the first stage, the control signal CS0, the peri voltage VPERI, and the DLL enable signal LEN are logically processed (e.g., operated), and in the second through sixth stages, the output of the previous stage, and the DLL enable signal LEN and each of the control signals CS1 through CS6 are logically processed.

The reset signal generator 210 preferably includes three dividers and one delay unit for receiving an input clock signal CLKin and generating a reset signal RST. The three dividers are triggered at the rising edge of the input clock signal CLKin in accordance with DLL enable signal LEN.

As shown in FIG. 2, the analog mode controller includes a divider 301 for dividing the input clock signal CLKin, and a delay unit 302 for generating an enable signal EN1 by delaying the output from the divider 301 and generating an enable signal EN2 when a locking signal that indicates the completion of the digital mode is enabled. A phase detector 303 operated by the enable signal EN2 detects the phase differences of the input clock signal CLKin and one delay clock signal D selected by the digital mode controller 200 and outputs pulse signals UP and DN. A charge pump 304 operated by the enable signal EN1 outputs the voltage of VCC~Vtp level in the digital operation mode and outputting the voltage of Vtn~VCC level in accordance with the pulse signals UP and DN outputted from the phase detector 303 in the analog operation mode. Finally, a differential amplifier 305 in the analog mode controller 300 outputs the control voltage VBN to the digital mode controller 200 in accordance with an output voltage from the charge pump 304. In the digital operation mode, the pulse signals UP and DN preferably maintain high level, and the gain of the differential amplifier 305 is 1.

Operations of the first preferred embodiment of the analog mixed digital DLL according to the present invention will now be described. The input buffer 100 buffers the external clock signal CLKext shown in FIG. 8A and outputs the input clock signal CLKin shown in FIG. 8B to the digital mode controller 200 and the analog mode controller 300, respectively.

Figure 7:
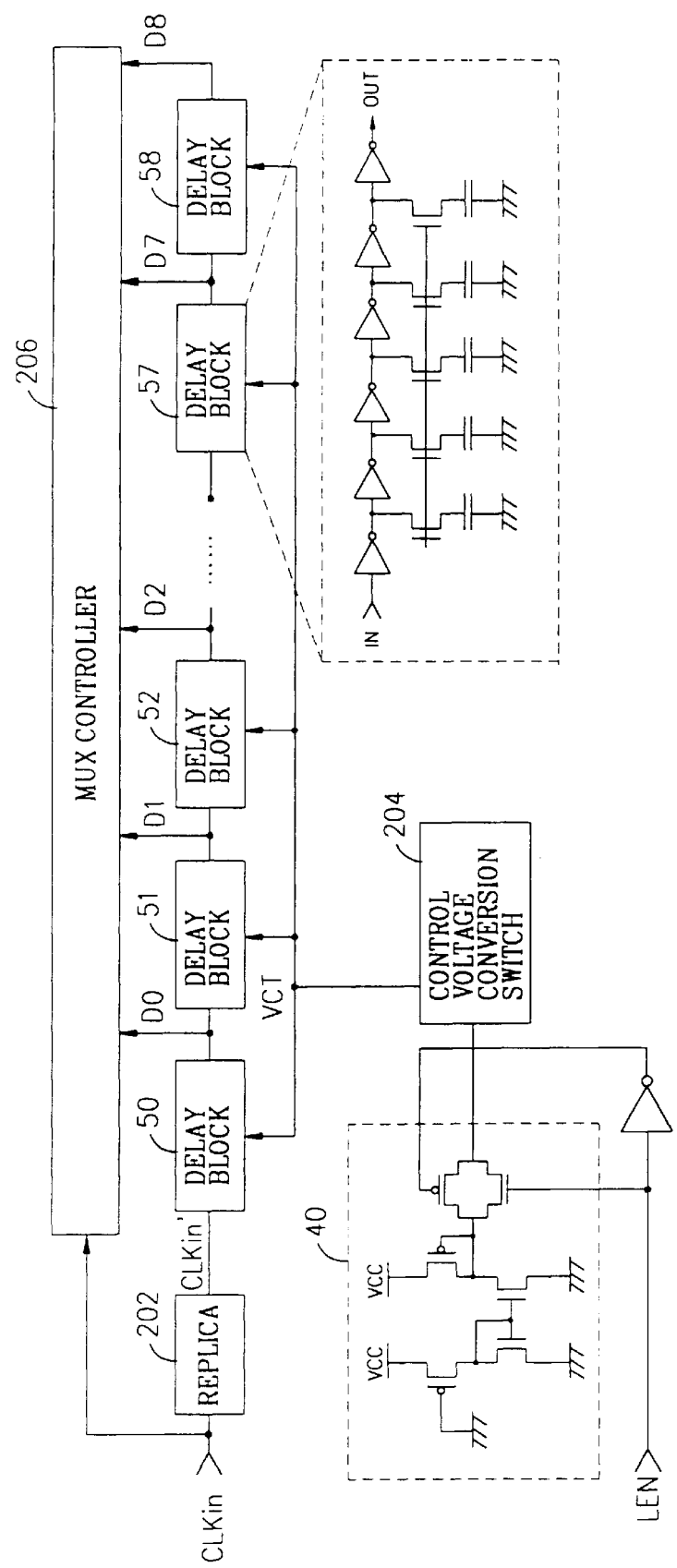
FIG. 7 is a block diagram illustrating one position of a replica in the digital operation mode of FIG. 2.

Digital mode operations of the first preferred embodiment of the DLL will now be described. When the DLL enable signal LEN is activated, a transmitting path of the input clock signal CLKin through the replica 202 as shown in FIG. 7 is formed by the switching operation of the replica moving switches 201–203 as shown in FIG. 2. The switching operation may be performed by the locking signal. As a result, the input clock signal CLKin is delayed by the replica 202 for a prescribed time, and the clock signal CLKin' delayed by the replica 202 as shown in FIG. 3 is inputted into a plurality of delay blocks 50–58 of the delay block array 205, respectively.

The control voltage conversion switch 204 receives an initial voltage. VCE of the VCC~Vtp level (Vtp represents the threshold voltage of the PMOS transistor) from the initial control voltage generator 40 and outputs a control voltage for controlling the delay ratios of the delay blocks 50–58. As shown in FIG. 3, since the locking signal maintains a high level before the digital locking is performed, the transmission gates TG10 and TG12 are turned on by the low level locking signals inverted by the inverters I1 and I2, so that the input lines 11 and 12 are electrically coupled with the output line 13, respectively. In this case in the digital operation mode, since the initial output level of the charge pump 304 is VCC~Vtp, and the gain of the differential amplifier 305 is 1, the voltage VBN of VCC~Vtp level is outputted through the differential amplifier 305. As a result, the initial voltage VCE and the voltage VBN maintain the identical electric potential of VCC~Vtp level, so that the control voltage VCT of VCC~Vtp level is outputted through the output line 13.

Therefore, the delay block array 205 sequentially delays the clock signal CLKin' in accordance with the control voltage VCT from the control voltage conversion switch 204 and outputs the delay clock signals D0–D8 as shown in FIGS. 8D–8G. At this time, as shown in FIG. 4, the delay blocks 50 and 51 are always enabled by the DLL enable signal LEN, and the delay clocks 52–58 are operated in the enable mode by the high level delay block enable signal YEN.

As shown in FIG. 5, the delay blocks 50–58 each set an initial value by the PMOS transistor and are operated in the enable mode by the DLL enable signal LEN and the delay block enable signal YEN. Therefore, the clock signal CLKin' inputted through the input terminal IN are sequentially delayed by the inverters, and are outputted through the output terminal OUT. The duration of the delay of each inverter is determined by the load across the shunt capacitor FET in accordance with the control voltage VCT. At this time, the initial control voltage VCT of the VCC~Vtp level is applied to each of the delay blocks 50–58 by reason of the delay characteristic of the shunt capacitor FET.

Figure 6:
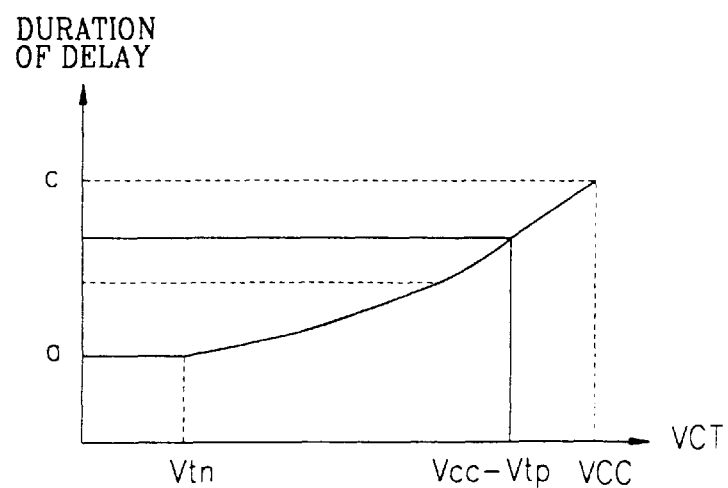
FIG. 6 is a graph illustrating a delay characteristic of a shunt capacitor with respect to a control voltage.

FIG. 6 illustrates the delay characteristic curve of the shunt capacitor FET based on the control voltage VCT. If the level of the control voltage VCT inputted into the NMOS transistor is 0~Vtn (Vtn represents the threshold voltage of the NMOS transistor (point "a"), it is impossible to prevent the increase of the delay of the locked delay clock signal D because of the temperature increase of the delay blocks 50–58 in the analog mode after the digital locking is performed. In addition, if the power supply voltage VCC is quickly changed in the analog operation mode (for example 2.7V changes to 2.3V ), it is impossible to properly cope with the quick decrease of the power supply voltage VCC.

In addition, if the level of the control voltage VCT is VCC (point "c" as shown in FIG. 6), it is impossible to properly cope with the increase of VCC. For example, assuming that the digital locking operation is performed by VCC of 2.3V, and the analog operation is performed by VCC of 2.7V, since there is not margin for increasing the duration of the delay, a bigger jitter occurs. For at least this reason and to overcome the above-describe problems, the initial control voltage VCE of VCC~Vtp level is applied as the control voltage VCT of the delay blocks 50–58.

However, the delay ratios of the delay clock signals D0–D8 which are generated by the delay block array 205 at the initial stage may not coincide with each other due to the wave form distortion, and the delay ratio difference may cause an abnormal locking of the multiplexer controller 206. To obtain a stable delay ratio, the delay clock signals D0–D8 are preferably provided to the multiplexer 206 for 8-dummy cycles after the DLL enable signal LEN is activated, and then the multiplexer controller 206 is operated by the reset signal generator 201 after the 8-dummy cycles. In this case, the 1-period of the reset signal RST corresponds to 8-cycle of the input clock signal CLKin, and each divider is triggered at the rising edge of the input clock signal CLKin.

The multiplexer controller 206 compares the phases of the delay signals D0–D8 from the delay block array 205 and the phase of the input clock signal CLKin and senses a locking point. In the case that a plurality of locking points are sensed, the multiplexer controller 206 outputs control signals SC0–SC7 for selecting the delay clock signal D, which has a predetermined phase delay rather than the input clock signal CLKin at the initial locking point (or has a same phase with respect to the input clock signal CLKin).

As shown in FIG. 9, the outputs from the flip-flops FF0–FF8 of the multiplexer controller, 206 are set to low level by the reset signal RST at the initial state for performing an initialization operation, and the reset signal RST is disabled after the 8-dummy cycle. When the reset signal RST is disabled, the flip-flops FF0–FF8 of the locking point detector 60 sample the delay clock signals D0–D8 at the rising edge of the input clock signal CLKin, and the NAND-gates ND0–ND7 sequentially compare the non-inverting output Q and the inverting output /Q of the flip-flops FF0–FF8 and sense the locking point. At this time, the locking point is a time point at which the phase of the delay clock signal leads that of the input clock signal CLKin and the phase of the next (neighboring) delay clock signal lags that of the input clock signal CLKin. Therefore, if there is an enough logic shift margin between the input clock signal CLKin and the delay clock signal D (in the locked state), the locking enable signals LE0–LE7 outputted from the NAND-gates ND0–ND7 maintain low level at every clock.

Figure 8:
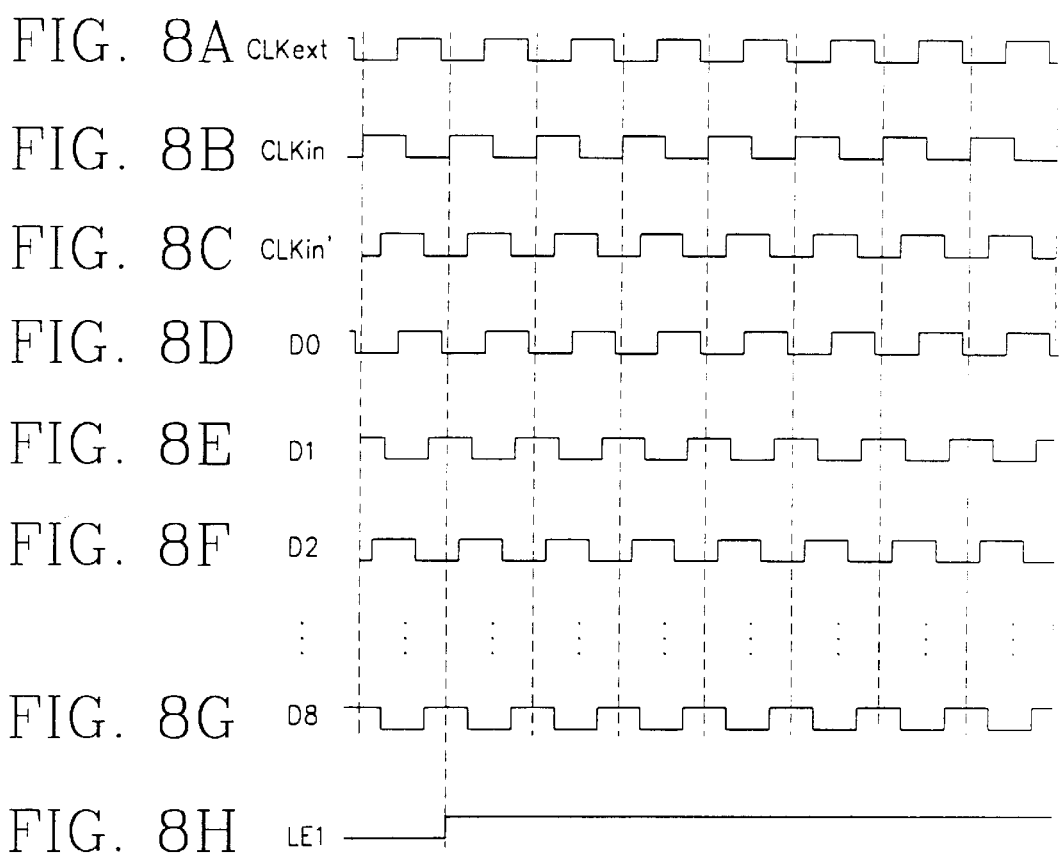
FIGS. 8A through 8H are waveform diagrams illustrating a delay of an input clock signal and a locking operation of a delay clock signal.

The delay clock signals D1 and D2 as shown in FIGS. 8E and 8F will now be described. As shown in FIGS. 8A–8H, the phase of the delay clock signal D1 leads rather than the input clock signal CLKin, and the phase of the delay clock signal D2 lags that of the input clock signal CLKin. Therefore, the outputs Q and 1Q of the flip-flop FF1 become a high level and a low level, respectively, at the rising edge of the input clock signal CLKin. Also, the outputs Q and /Q of the flip-flop FF2 become a low level and a high level, respectively, at the rising edge of the input clock signal CLKin. Therefore, as shown in FIG. 8H, the NAND-gate ND1 outputs a low level locking enable signal LE1, and the remaining NAND-gates ND0 and ND2–ND7 output a high level locking enable signal (LE0, LE2–LE7).

However, if the phases of the input clock signal CLKin and the delay clock signal D are almost same, the pulse-shaped low level locking enable signals LE0–LE7 are outputted, and thus a plurality of locking points may be generated. In order to overcome the above-described problems, the present invention detects the initial locking point and latches the detected the initial locking point. Therefore, even when the locking point is varied, the locking point of the selected (locked) delay clock signal D is controlled not to be changed. Namely, the latch unit 61 latches the low level locking enable signal LE1 outputted from the NAND-gate ND1 in accordance with the inverted reset signal RST and outputs the low level locking signal.

In addition, the inverters I12–I5 of the control signal output unit 62 invert the output from the SR latch 123 and outputs a high level short pulse signal, and the flip-flops FF9–F16 invert the locking enable signals LE0–LE7 from the locking point detector 60 in accordance with a high level short pulse signal, and the inverted outputs /Q of the flip-flops FF9–FF16 are inverted by the inverters I20–I27. Therefore, the DC level control signal CS1 becomes a low level, and the DC level control signals CS0 and CS2–CS7 become high level.

The pulse generator 207 receives DC level control signals Cg1–CS7 from the multiplexer controller 206 and outputs a row level pulse signal PS1 and high level pulse signals PS2–PS7, respectively. The selection signal generator 208 receives control signals CS0–CS6 and pulse signals PS1–PS7 from the multiplexer controller 206 and the pulse generator 207 and outputs selection signals SEL0–SEL7 for selecting the locked delay clock signal D2.

As shown in FIG. 10, the logic operation unit 70 sequentially computes the low level control signal CS1 and the high level control signals CS0 and CS2–CS6 and outputs a high level signal LOW1 and the low level signals LOW2–LOW7. The selection signal generator unit 71 receives a high level output signal LOW1 and the low level output signals LOW2–LOW7 from the logic operation unit 70, and receives a low level pulse signal PS1 and high level pulse signals PS2–PS7 from the pulse signal generator 207 and outputs a low level selection signal SEL1 and the high level selection signals SEL0 and SEL2–SEL7.

As shown in FIG. 10, in this case, the flip-flop FF20 of the first selection signal generator 132 receives a high level control signal CS0 through the inverters I30 and I31 and outputs a high level selection signal SEL0, and the SR latch 125 of the second selection signal generator 133 outputs a high level signal in accordance with a low level pulse signal PS1. Thus, the flip-flop FF21 receives an output of the SR latch 125 through the inverters I32–I34 and outputs a low level selection signal SEL1. Similarly, the SR latch 125 of the third through eighth selection signal generators 134–139 outputs a low level signal in accordance with the high level pulse signals PS2–PS7 and the low level output signals LOW2–LOW7. Therefore, the flip-flop FF21 receives an output of the SR latch 125 through the inverters I18–I20 and outputs high level selection signals SEL2–SEL7.

In this case, the multiplexer 209 outputs a locked delay clock signal D2 among the delay clock signals D0–D8 in accordance with the selection signals SEL0–SEL7 outputted from the selection signal generator 208. Also, the multiplexer 209 sequentially processes the control signals CS0–CS6 and outputs delay block enable signals YEN0–YEN6 to the delay block array 205 for disabling the delay blocks 53–58 after the delay block 52.

As shown in FIG. 11, according to the example, the transmission gate TG2 is turned on by the low level selection signal SEL1 and the high level selection signals SEL0 and SEL2–SEL7 outputted from the selection signal generator 208. The remaining transmission gates TG1 and TG3–TG8 are turned off. Therefore, the delay clock signal D2 locked to the input clock signal CLKin is outputted to the output terminal through the turned-on transmission gate TG2. In addition, the delay block array controller 81 outputs the high level delay block enable signal YEN0 and the low level delay clock enable signals YEN1–YEN6 to the delay blocks 52–58 in accordance with the low level control signal CS1, the high level control signals CS0 and CS2–CS7 and the high level peri- voltage VPERI.

Therefore, the delay blocks 50–52 are operated in the enable mode by the high level delay block enable signal YEN0, and the delay blocks 53–58 are operated in the disable mode since the output from the NAND-gate as shown in FIG. 5 is fixed to a high level by the low level delay block enable signals YEN1–YEN6. As a result, current consumption caused by the delay blocks 53–58 is decreased.

As described-above, in the digital mode operation, preferably the digital mode controller 200 compares the phases of the clock signals D0–D8, which are delayed more than 1-cycle, and the input clock signal CLKin to detect a locking point and output one delay clock signal D2 locked to the input clock signal CLKin and having a phase lagging the input clock signal CLKin at the detected locking point.

Operations after digital locking of the first preferred embodiment of the DLL will now be described. When the digital mode operation is completed, as shown in FIG. 2, the connection between the replica 202 and the replica moving switch 203 is disconnected, and the input clock signal CLKin outputted from the input buffer 100 is inputted into the delay blocks 50–58 of the delay block array 205 through the replica moving switch 203. The multiplexer controller 206 sequentially compares the phase of the input clock signal CLKin and each phase of the delay clock signals D0–D8 from the delay block array 205. In this case, the input clock signal CLKin is directly inputted into the delay block array 205, not through the replica 202. When the replica is added to each of the delay blocks 50–58 to consider the delay of the replica, the area of the layout is increased and a current consumption is significantly increased.

Figure 12:
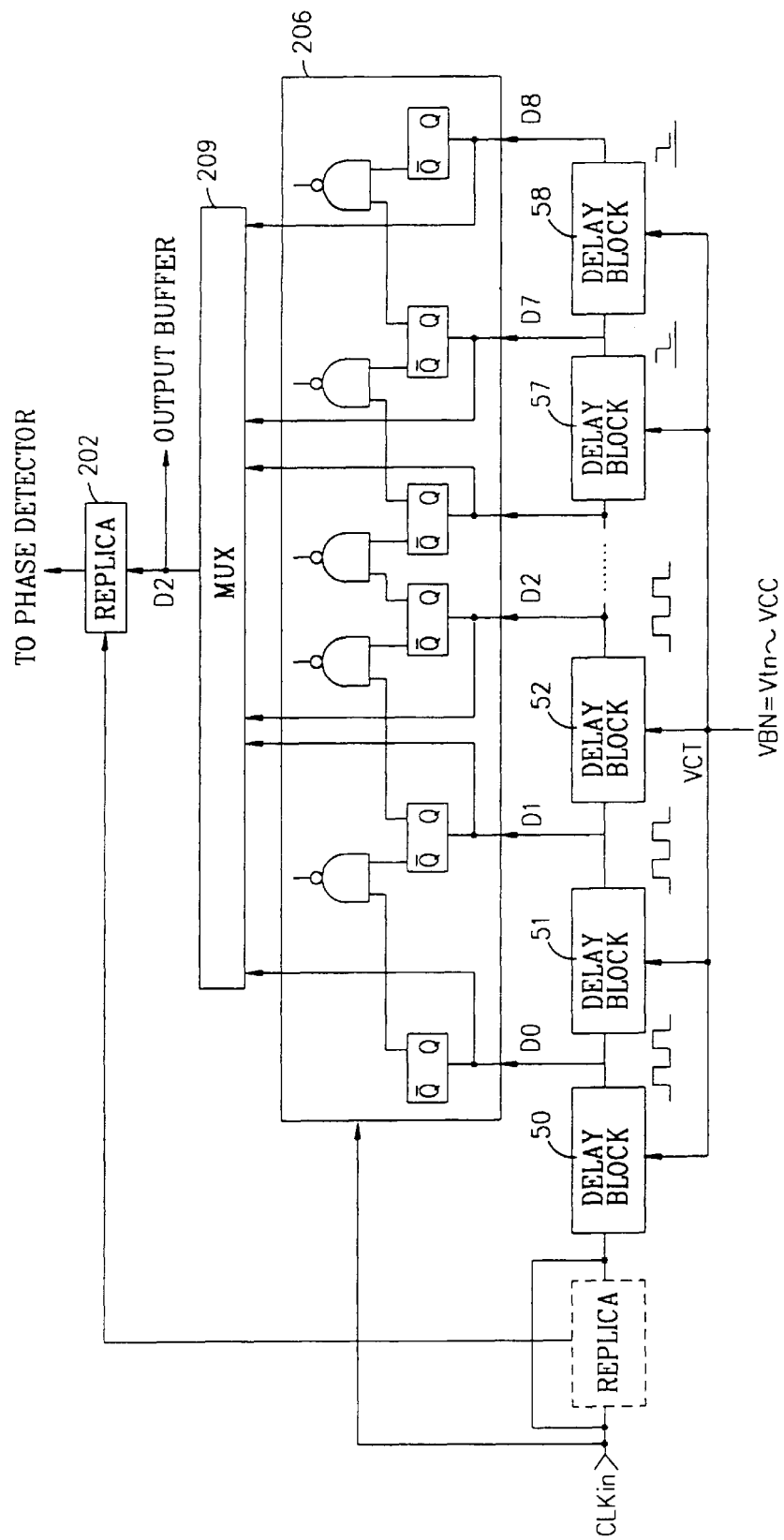
FIG. 12 is a block diagram illustrating exemplary positions of a replica in the analog operation mode of FIG. 2.
Figure 13:
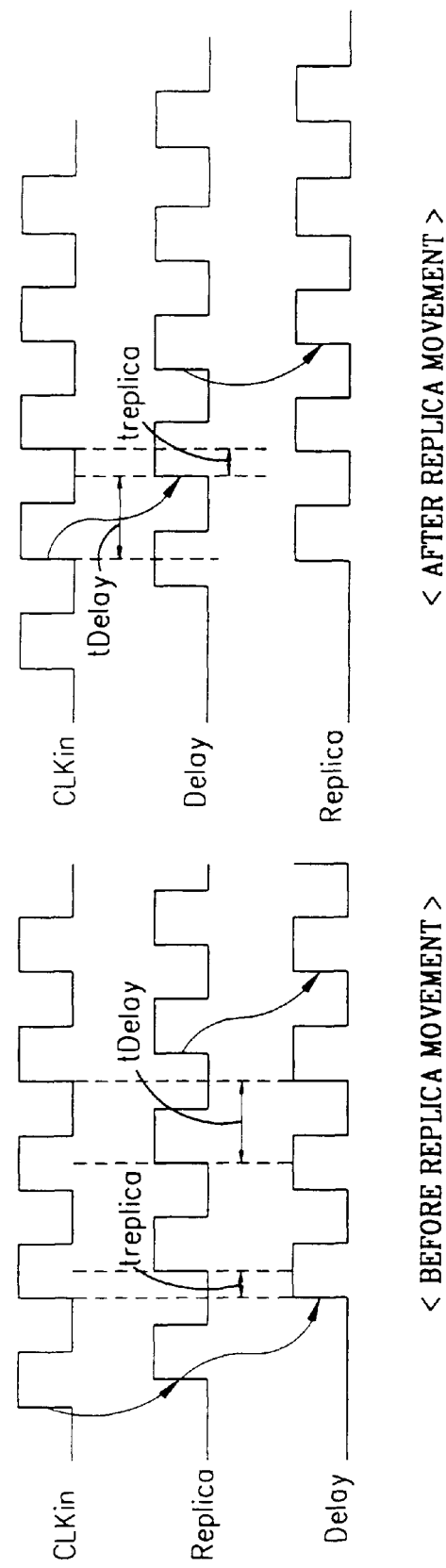
FIG. 13 is a waveform diagram illustrating delay duration of one (1) cycle before movement of a replica and after movement of the replica of FIG. 2.

Therefore, after digital locking, the position of the replica 202 is moved to be after the multiplexer 209 for obtaining a clock signal having a desired duration of the negative delay through the replica 202. Accordingly, when the digital mode operation is completed, the replica 202 is positioned after the multiplexer 209 as shown in FIG. 12. Therefore, the delay clock signal D2 from the multiplexer 209 is delayed by the replica 202 and is inputted into the phase detector 303 of the analog mode controller 300.

After digital locking, when comparing a one-cycle delay duration before the movement of the replica 202 and after the movement of the replica 202 as shown in FIG. 12, the 1-cycle delay duration is identical since tReplica+tDelay= tDelay+tReplica. As a result of the simulation, even through some duration of the delay is added because of the load difference between the connections, the analog operation controls the delay duration by a control voltage to coincide the phase of the delay clock signal D2' with the input clock signal CLKin, so that the characteristic is not affected.

Figure 14:
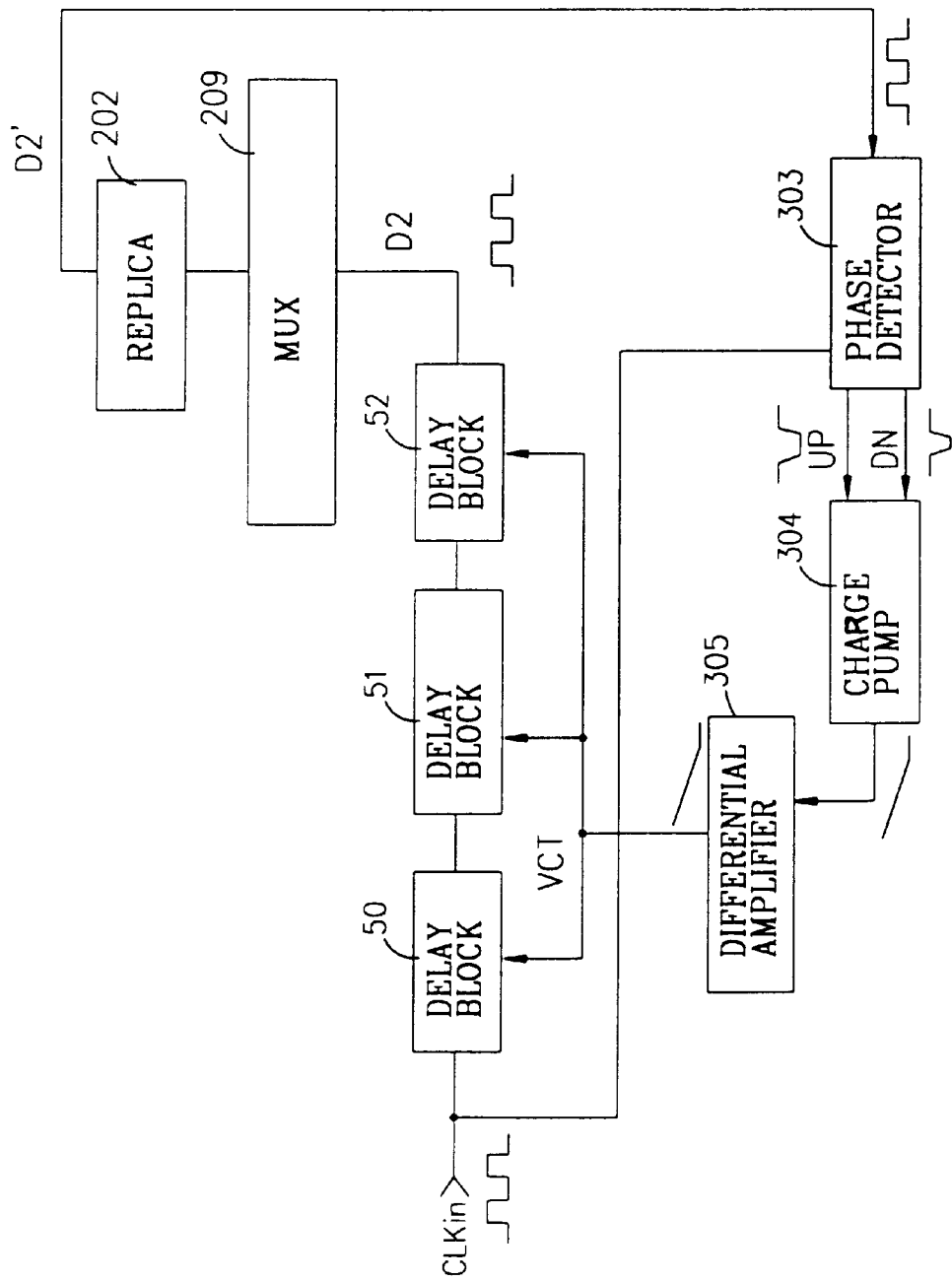
FIG. 14 is a block diagram illustrating an analog operation mode of FIG. 2.

Analog mode operations of the first preferred embodiment of the analog mixed digital DLL will now be described. The analog mode controller 300 performs a fine tuning operation to align the phase of the delay clock signal D2 delayed by the digital mode controller 200 with the phase of the input clock signal CLKin. If a low level locking signal is outputted from the multiplexer controller 206 after digital locking, as shown in FIG. 3 the transmission gates TG10 and TG12 of the control voltage conversion switch 204 are turned off, and the transmission gate TG11 is turned on, to electrically couple the input line 11 and the output line 13. Therefore; as shown in FIG. 14, the output voltage VBN of the differential amplifier 305 is inputted into the delay clocks 50–58, respectively, as the control voltage VCT. After the locking signal is inputted, the delay unit 302 outputs an enable signal EN2 preferably after 2-cycle for thereby operating the phase detector 303. The phase detector 303 detects the phase difference between the input clock signal CLKin and the delay clock signal D2' passed through the replica 202. As a result of the detection process, if the phase of the delay clock signal D2' leads rather than that of the input clock signal CLKin, the width of the pulse signal DN becomes wider than the width of the pulse signal UP. Otherwise, the width of the pulse signal UP becomes wider than the width of the pulse signal DN.

At an initial stage of the analog mode, since the phase of the delay clock signal D2' is to be delayed rather than the input clock signal CLKin the phase detector 303 generates the pulse signal UP having a width wider than that of the pulse signal DN to weaken the driving capacity of the charge pump 304 as shown in FIG. 14. Therefore, the output voltages VBN and Vtn through VCC from the differential amplifier 305 are decreased. As a result, the NMOS transistors of each of the delay blocks 50–52 as shown in FIG. 5 are weakly turned on by the decreased control voltage VCT, so that the load across the capacitor FET is decreased, and the delay duration of the corresponding inverters are decreased.

As the above-described processes are repeatedly performed, when the phases of the input clock signal CLKin and the delay clock signal D2 coincide, the widths of the pulse signals DN and UP from the phase detector 303 become substantially identical so that the output from the charge pump 32 becomes stable. This state is preferably a final locking state of the analog mode controller 300. At this time, the delay clock signal D2 is outputted from the multiplexer 209 to an output buffer (not shown) as the final internal clock signal CLKint.

If a phase coincidence is destroyed by a detailed delay duration variation because of one or more of a variation of the operation voltage, an introduction of an external noise and a temperature increase, the phase detector 303 monitors such variation and outputs the pulse signals DN and UP for controlling the output voltage VBN of the differential amplifier 305. As a result, the delay duration of the delay blocks 50–52 are varied by the output voltage VBN, which is the control voltage VCT, to implement a phase coincidence.

As shown in FIG. 14, the output voltage VBN=Vtn~VCC of the differential amplifier 305 are inputted into the locked delay block 52 and the delay blocks 50 and 51 in the analog mode operation. In the case that the delay blocks 50–52 are all operated in the analog mode, since the delay duration of the delay blocks 50–52 are increased, the effects based on the noise, etc. are increased.

Figure 15:
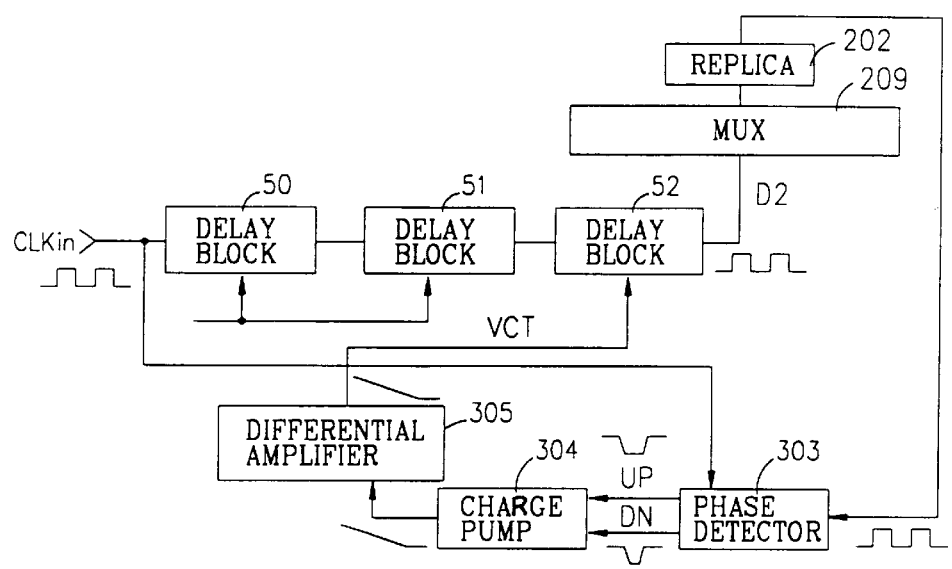
FIG. 15 is a block diagram illustrating an analog mixed digital DLL according to another preferred embodiment according to the present invention.

FIG. 15 illustrates a second preferred embodiment of an analog mixed digital DLL according to the present invention. As shown in FIG. 15, in analog mode operations, the control voltages VCC~Vtp of digital operation mode is inputted into the delay blocks 50 and 51, and the output voltage VBN=Vtn~VCC of the differential amplifier 305 are applied to the delay block 52 to decrease the effects because of noise. At this time, in the control voltage conversion switch 204 as shown in FIG. 3, the switch SW1 switches the selection signal SEL instead of the locking signal. Therefore, in the digital mode operation, the control voltage VCT of the VCC~Vtp level is applied to the delay clocks 50–58 based on the high level locking signal. If the delay block 52 is locked, for example, the control voltage VCT of the VCC~Vtp level is inputted into the delay blocks 50 and 51 by the selection signals SEL0 and SEL1 of the low and high levels, and the output voltage VBN of the differential amplifier 305 is applied to the delay block 52 as a control voltage VCT.

As a result, the control voltage VCT of the delay blocks 50 and 51 becomes VCC~Vtp level in the digital and analog operation modes. Further, the control voltage VCT of the delay block 52 becomes the VCC~Vtp level in the digital operation mode, and the control voltage VCT of the delay block 52 becomes Vtn~VCC in the analog operation mode.

Figure 16:
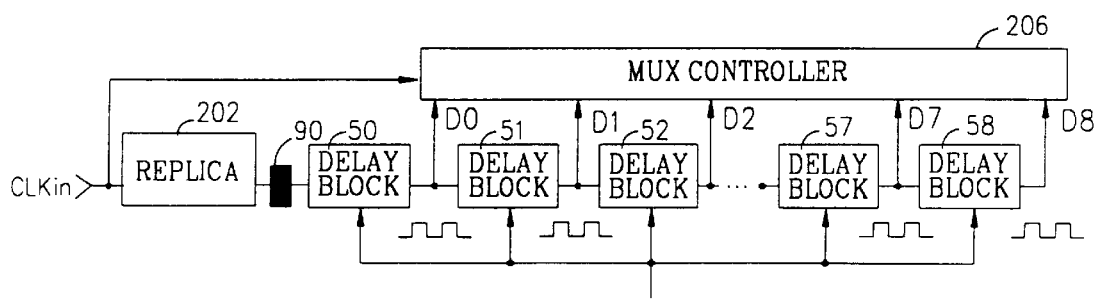
FIG. 16 is a block diagram illustrating an analog mixed digital DLL according to another preferred embodiment according to the present invention.

FIG. 16 illustrates a third preferred embodiment of an analog mixed digital DLL according to the present invention. As shown in FIG. 16, a compensation delay block 90, which has the same delay duration as the replica 202, is additionally provided in the front of the delay block 50 for thereby compensating the excessive delay duration of the replica 202 caused by the external factors such as the temperature, noise, etc. The compensation delay block 90 operates as a delay unit in the analog operation mode.

Figure 17:
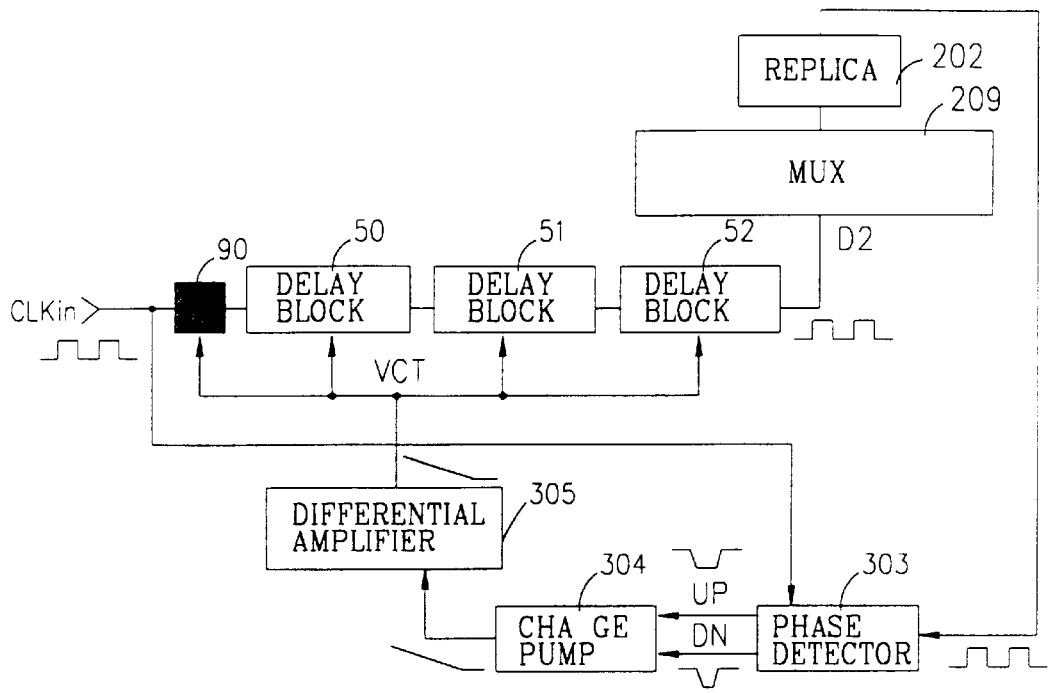
FIG. 17 is a block diagram illustrating an analog operation mode according to the analog mixed digital DLL of FIG. 16.

Therefore, in the digital mode operations, the output from the replica 202 is compensated by the compensation delay unit 90 and is inputted into the delay blocks 50–58, respectively. Also, as shown in FIG. 17, in the analog mode operations, since the delay ratio of the compensation delay unit 90 is varied by the control voltages VCT=Vtn~VCC from the differential amplifier 305, the excessive duration of the delay of the replica 202 is compensated.

Figure 18:
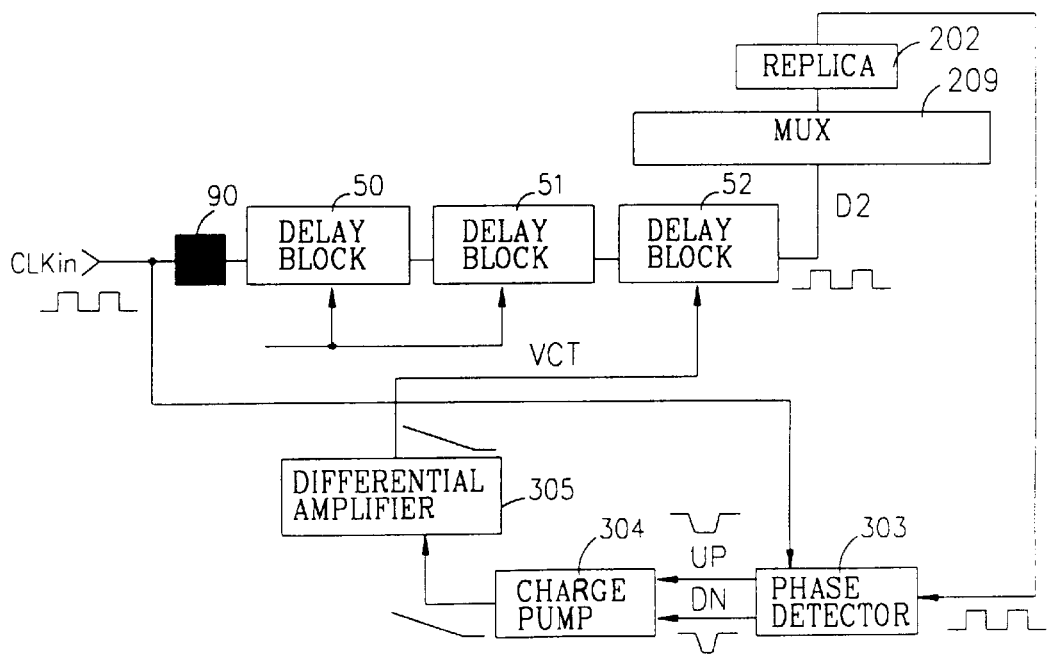
FIG. 18 is a block diagram illustrating an analog operation mode of another preferred embodiment of the present invention.

FIG. 18 illustrates a fourth preferred embodiment of the present invention that decreases the effects caused by the noise in the analog mode operations. As shown in FIG. 18, in analog mode operations, the control voltage VCC~Vtp, which is preferably used in a digital operation mode is applied to only the delay blocks 50 and 51, and the output voltage VBN=Vtn~VCC of the differential amplifier 305 is applied to the delay block 52 to decrease the effects caused by the noise. At this time, the switching operation of the control voltage conversion switch 204 is performed similar to the second preferred embodiment of the present invention.

In the preferred embodiments according to present invention, the 9-stage delay block was described as art example. However, the present invention is not intended to be so limited. Accordingly, a number of the delay blocks may be varied.

Preferred embodiments of an analog mixed digital DLL and corresponding operations are described above, including for example, FIG. 2 that depicts a digital mode controller 200 and an analog mode controller 300. However, the present invention is not intended to be so limited. For example, so long as required functions are performed, circuits can be grouped, combined or subdivided into single or additional elements. For example, the digital mode controller 200 as shown in FIG. 2 can be grouped into a controller, replica moving switches 201, 203, delay block array 205 and control voltage conversion switch 204. In this example, the controller of the digital mode controller 200 could combine and/or selectively perform operations of a reset signal generator 210, multiplexer controller 206, pulse generator 207, selection signal generator 208 and multiplexer 209.

As described above, the preferred embodiments of an analog mixed digital DLL according the present invention have various advantages. In the preferred embodiments of a DLL according to present invention, a wide band frequency operation can be implemented based on a plurality of delay blocks. In addition, it is possible to accurately control the detail variation of the delay duration caused by at least an operation voltage, an external noise and a temperature increase.

In the preferred embodiments according to present invention, multi-locking can be prevented during the wide band frequency operation by latching an initial locking point. In addition, current consumption can be decreased by disabling the delay blocks after the locked delay block.

A layout area and current consumption may be decreased by moving the position of the replica into a rear portion of the multiplexer in the analog mode operation after the digital locking operation. Furthermore, an internal clock signal can be quickly generated from an external clock signal when detecting the locking point by comparing the phases of the delay clock signals, which are delayed more than 1-cycle, and the input clock signal and selecting one delay clock signal, which is locked to the input clock signal at the detected locking point, and has a phase lagging the input clock signal.

An analog mixed digital DLL according to the preferred embodiments, implements an excellent jitter characteristic and a large noise immunity by at least compensating the excessive delay duration of the replica and differently controlling the control voltage applied to the delay block after the digital locking operation.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An analog mixed digital Delay Locked Loop (DLL), comprising:
   a digital mode controller that comprises,
      a controller,
      a control voltage converting switch, and
      a delay circuit having a plurality of sequential delay blocks that receives a first clock signal and outputs a plurality of delay clock signals based on the first clock signal, wherein the controller detects a first locking point by comparing phases of the plurality of delay clock signals and the first clock signal, wherein the controller selects one delay clock signal of the plurality of delay clock signals that is locked to the first clock signal at the detected first locking point, and wherein the controller outputs a first control signal for the delay blocks;
   an analog mode controller that compares the phase of the one selected delay clock signal received from the controller and the phase of the first clock signal and outputs a first control voltage to the control voltage converting switch, wherein the control voltage converting switch selectively provides the first control voltage and a second control voltage to the delay blocks in accordance with a digital operation mode and an analog operation mode.

2. The DLL of claim 1, wherein the delay blocks are a voltage controlled delay units, each having a duration varied in accordance with a level of the first and second control voltages.

3. The DLL of claim 1, wherein the delay clock signals are provided by the plurality of delay blocks coupled in series, wherein a first delay block receives the first clock signal, and the first locking point is a time point in which a phase of one delay clock signal leads the first clock signal and a phase of the next successive delay clock signal lags the first clock signal at the rising edge of the first clock signal.

4. The DLL of claim 1, wherein when the first locking point is detected, each of the delay blocks sequentially after a delay block that outputs the one selected delay clock signal are turned off according to the first control signal.

5. The DLL of claim 1, wherein the first control voltage is a range of approximately Vtn~VCC and the second control voltage is approximately VCC~Vtp, and wherein the VCC is a first prescribed reference voltage, the Vtn is a first prescribed threshold voltage and the Vtp is a second prescribed threshold voltage.

6. The DLL of claim 1, wherein the control voltage converting switch outputs the first and second control voltages to the delay blocks in the digital operation mode and outputs the first control voltage to the delay blocks in the analog operation mode.

7. The DLL of claim 6, wherein in the digital operation mode, the first and second control voltages are the same being a first prescribed reference voltage less a second prescribed threshold voltage.

8. The DLL of claim 1, wherein the control voltage converting switch comprises:

a first inverter that inverts a locking signal;
a first switch that switches between a selection signal and the locking signal;
a second inverter that inverts the output of the first inverter;
a third inverter that inverts an output of the first switch;
a first transmission gate coupled in parallel between first and second control voltage input lines that couples the first and second control voltage input lines in accordance with an output of the second inverter; and
second and third transmission gates that output the first and second control voltages in accordance with an output of the third inverter.

9. The DLL of claim 8, wherein the first and third transmission gates are a first type, and the second transmission gate is a complementary type of the first and third transmission gates.

10. The DLL of claim 8, wherein the first switch switches the locking signal, wherein the first and second control voltages are approximately VCC~Vtp in the digital operation mode, wherein the first control voltage is a range of approximately Vtn~VCC and the second control voltage is approximately VCC~Vtp in the analog operation mode, and wherein the VCC is a first prescribed reference voltage, the Vtn is a first prescribed threshold voltage and the Vtp is a second prescribed threshold voltage.

11. The DLL of claim 1, wherein the plurality of delay blocks are coupled in series, and wherein the selected delay block and precursor delay blocks receives the first control voltage having a range of approximately Vtn~VCC level in the analog mode operation, and wherein the VCC is a first prescribed reference voltage and the Vtn is a first prescribed threshold voltage.

12. The DLL of claim 1, wherein the delay blocks are coupled in series, and wherein the one selected delay block receives the first control voltage, and antecedent delay blocks to the one selected delay block receive the second control voltage in the analog operation mode.

13. The DLL of claim 12, wherein the first control voltage is a range of approximately Vtn~VCC and the second control voltage is approximately VCC~Vtp, and wherein the VCC is a first prescribed reference voltage, the Vtn is a first prescribed threshold voltage and the Vtp is a second prescribed threshold voltage.

14. The DLL of claim 1, wherein the controller comprises:
switching means that selectively enable one of two connections to a replica in the digital mode controller;
a multiplexer controller that compares the phases of the delay clock signals and the first clock signal to output a locking signal, and wherein the multiplexer controller outputs a plurality of control signals that control a path of the delay clock signals;
a pulse generator that receives the control signals and generating a plurality of pulse signals;
a selection signal generator that receives the control signals and the pulse signals from the multiplexer controller and the pulse generator, respectively, and outputs a plurality of selection signals; and
a multiplexer that outputs the one selected delay clock signal among the delay clock signals in accordance with the selection signals and outputs a plurality of enable signals that control operation of the delay blocks in accordance with the control signals from the multiplexer controller.

15. The DLL of claim 14, wherein the delay blocks are each a voltage control delay unit that generates a substantially equal delay duration with respect to a control voltage, and wherein said each of the delay blocks is formed of a shunt capacitor inverter.

16. The DLL of claim 14, wherein the first and second delay blocks of the plurality of delay blocks are operated by a DLL enable signal, and the remaining delay blocks transition between an enable mode and a disable mode in accordance with a delay block enable signal, wherein each delay block comprises:
   a logic-gate that logically combines the first clock signal and the delay block enable signal;
   a plurality of inverters coupled in series that sequentially delay the output of the logic-gate;
   a first and second switches that vary a number of the plurality of inverters; and
   a first transistor and capacitor coupled in series between an output terminal of each of the inverters and a first prescribed reference voltage, wherein the first transistor receives a control voltage through its control electrode.

17. The DLL of claim 16, wherein the first transistor is a n-type MOS transistor, the capacitor is a FET, and the delay duration of the inverters is determined by a load of the capacitor based on a turning-on state of the MOS transistor.

18. The DLL of claim 16, further comprising a second transistor coupled between a second prescribed reference voltage and the output terminal of the logic-gate and between the second prescribed reference voltage and the output terminal of an even numbered inverter of the plurality of inverters, and wherein a control electrode of the second transistor receives the delay block enable signal.

19. The DLL of claim 14, wherein the switching means includes first and second replica moving switches to move the connection to the replica to a front portion of the delay blocks before a digital locking operation and move the connection to the replica to a rear portion of the multiplexer after the digital locking operation is performed.

20. The DLL of claim 19, wherein the switching operation of the first and second replica moving switches is controlled by the locking signal.

21. The DLL of claim 14, wherein the pulse signal generator receives the control signals except for a first control signal among the plurality of control signals outputted from the multiplexer controller.

22. The DLL of claim 14, wherein a delay block coupled after the selected delay block is disabled by a corresponding one of the enable signals from the multiplexer in the analog operation mode.

23. The DLL of claim 14, wherein the selected delay block is selected by the enable signals from the multiplexer and the previous delay blocks coupled before the selected delay block receive the first control voltage having a range of approximately Vtn~VCC level outputted from the analog mode controller, and wherein the VCC is a first prescribed reference voltage and the Vtn is a first prescribed threshold voltage.

24. The DLL of claim 14, wherein the selected delay block receives the first control voltage from the analog mode controller, and previous delay blocks receives the second control voltage.

25. The DLL of claim 24, wherein a range of the first control voltage is approximately Vtn~VCC and the second control voltage is approximately VCC~Vtp, and wherein the VCC is a first prescribed reference voltage, the Vtn is a first prescribed threshold voltage and the Vtp is a second prescribed threshold voltage.

26. The DLL of claim 14, further comprising a compensation delay unit coupled at an input of a first delay block of the delay blocks that has the same delay duration as the replica.

27. The DLL of claim 26, wherein the compensation delay unit is operated as a variable delay unit in accordance with the first control voltage from the analog mode controller in the analog operation mode, and wherein blocks between a first delay block and the selected delay block of the plurality of delay blocks and the compensation delay unit receive the first control voltage having a range of approximately Vtn~VCC, and wherein the VCC is a first prescribed reference voltage and the Vtn is a first prescribed threshold voltage.

28. The DLL of claim 26, wherein the selected delay block receives the first control voltage having a range of approximately Vtn~VCC outputted from the analog mode controller, and delay blocks prior to the selected delay block receive a second control voltage substantially equal to VCC~Vtp level, and wherein the VCC is a first prescribed reference voltage, the Vtn is a first prescribed threshold voltage and the Vtp is a second prescribed threshold voltage.

29. The DLL of claim 14, wherein the controller further comprises a reset signal generator comprises:
   three dividers that divide the first clock signal; and
   a delay unit that delays the outputs of the dividers, wherein the dividers are triggered at a rising edge of the first clock signal.

30. The DLL of claim 14, wherein the multiplexer controller comprises:
   a locking point detector that compares the plurality of delay clock signals from the delay blocks and the first clock signal and determines the detected first locking point;
   a latch unit that latches the first locking point and outputs the locking signal; and
   a control signal output unit that outputs the control signals by sampling locking enable signals from the locking point detector according to an output of the latch unit.

31. The DLL of claim 30, wherein the locking point detector comprises:
   a plurality of flip-flops enabled by the reset signal that samples the delay clock signals at a rising edge of the first clock signal; and
   a plurality of logic gates that output the locking enable signals by sequentially logically processing a non-inverted output of the corresponding flip-flop and an inverted output of the next flip-flop.

32. The DLL of claim 31, wherein the logic gates are NAND-gates.

33. The DLL of claim 30, wherein the latch unit comprises:
   first and second NAND-gates that logically process respective portions of the locking enable signals outputted from the locking point detector;
   a NOR-gate that NORs the outputs of the first and second NAND-gates;
   a SR latch that latches the output of the NOR-gate in accordance with an inverted reset signal; and
   an inverter that inverts the output of the SR latch and outputs the locking signal.

34. The DLL of claim 30, wherein the control signal output unit comprises:
   a plurality of flip-flops that invert the locking enable signals from the locking point detector in accordance with the output of the latch unit; and
   a plurality of inverters that invert the outputs of the flip-flops and output the plurality of control signals.

35. The DLL of claim 14, wherein the selection signal generator comprises:

a pulse signal generator that receives a subset of the control signals from the multiplexer controller and outputs a plurality of short pulse signals;

a logic operation unit that sequentially logically processes the subset of the control signals outputted from the multiplexer controller and generates a plurality of output signals; and a selection signal generator unit that generates a plurality of selection signals in accordance with the output signals from the logic operation unit and the pulse signals from the pulse signal generator.

36. The DLL of claim 35, wherein the pulse signal generator does not receive the first control signal among the control signals, and the logic operation unit is a plurality of AND-gate stages in which each stage is formed of a NAND-gate and an inverter, and the output signal of said each stage is an input of the next stage.

37. The DLL of claim 35, wherein the selection signal generator unit includes a plurality of selection signal units that output the plurality of selection signals, wherein a first selection signal unit comprises:

series coupled first and second inverters that sequentially invert the first control signal; and a flip-flop that receives the output of the second inverter in accordance with the first clock signal, wherein the remaining selection signal units each comprise, a SR latch including two NAND-gates, series coupled third, fourth and fifth inverters that sequentially invert an output of the SR latch, and a flip-flop that receives an output of the fifth inverter in accordance with the first clock signal.

38. The DLL of claim 14, therein the multiplexer comprises:

a multiplexer circuit that outputs the selected delay clock signal in accordance with the selection signals from the selection signal generator; and a delay block controller that generates the enable signals to control the operation of the delay blocks by logically computing the control signals and the DLL enable signal from the multiplexer controller.

39. The DLL of claim 38, wherein the multiplexer comprises:

a plurality of transmission gates having a common output terminal for transmitting the selected delay clock signal selected by the selection signals; and a NMOS transistor coupled in parallel with the common output terminal, wherein the delay block controller is a plurality of stages in which each stage is formed of a NAND-gate and inverter, and the output signal of said each stage except a last stage is inputted into the next stage.

40. The DLL of claim 1, wherein the analog mode controller comprises:

a divider that divides the first clock signal;

a delay unit that generates a first enable signal by delaying an output signal from the divider and generates a second enable signal according to a locking signal;

a phase detector operated by the second enable signal from the delay unit that generates the first and second pulse signals by detecting a phase difference between the first clock signal and the one selected delay clock signal;

a charge pump operated by the first enable signal that outputs a first voltage in the digital operation mode, and outputs a second voltage in accordance with the first and second pulse signals received from the phase detector in the analog operation mode, and a differential amplifier that outputs the first control voltage in accordance with the first and second voltages outputted from the charge pump.

41. The DLL of claim 40, wherein the widths of the first and second pulse signals are the same in the digital operation mode, and the gain of the differential amplifier is 1.

42. The DLL of claim 40, wherein said first voltage is approximately VCC~Vtp, and said second voltage is a range of approximately Vtn~VCC, and wherein the VCC is a first prescribed reference voltage and the Vtn is a first prescribed threshold voltage.

43. The DLL of claim 1, wherein the digital mode controller further comprises a replica connected in series to the delay circuit, and wherein the controller comprises switching circuitry that connects the replica in series to an input terminal of the delay circuit during the digital operation mode before selection of the one selected delay clock signal and connects the replica in series after the delay circuit during the analog operation mode after selection of the one selected delay clock signal.

44. The DLL of claim 1, wherein a number of delay blocks in the delay circuit is fewer in the analog operation mode than the digital operation mode.

45. An analog mixed digital DLL, comprising:

an analog mode controller that outputs a first control voltage by comparing the phases of a locked delay clock signal and a first clock signal;

a replica moving switch that moves a coupling position for connection to a replica;

a control voltage converting switch that switches the first control voltage and a second control voltage in accordance with a digital operation mode and an analog operation mode;

a delay block array formed of a plurality of delay blocks each having a delay duration varied by the first and second control voltages, and wherein the delay blocks sequentially delay the first clock signal, wherein the coupling position of the replica moving switch is one of before and after the delay block array;

a multiplexer controller that outputs a locking signal by comparing the phases of delay clock signals from the delay block array and the first clock signal, and wherein the multiplexer controller outputs control signals that control a path of the delay clock signals;

a selection signal generator that receives the control signals and outputs a plurality of selection signals; and a multiplexer that outputs the locked delay clock signal of the delay clock signals selected by the selection signals, and wherein the multiplexer outputs enable signals to control the delay blocks using the control signals received from the multiplexer controller.

46. The DLL claim 45, wherein the plurality of the delay blocks are voltage controlled delay units, each capable of varying the delay duration in accordance with a control voltage.

47. The DLL of claim 45, wherein when the locked delay clock signal is detected, the delay blocks coupled after a selected delay block that outputs the locked delay clock signal are turned off according to the enable signals from the multiplexer.

48. The DLL of claim 45, wherein the first control voltage is a range of Vtn~VCC, and the second control voltage is approximately VCC~Vtp, and wherein the VCC is a first prescribed reference voltage, the Vtn is a first prescribed threshold voltage and the Vtp is a second prescribed threshold voltage.

49. The DLL of claim 45, wherein the second control voltage is an output voltage of an initial voltage generator, and the control voltage converting switch outputs the first and second control voltages to the delay blocks in the digital operation mode, and outputs the first control voltage to the delay blocks in the analog operation mode.

50. The DLL of claim 49, wherein the first and second control voltages are VCC~Vtp in the digital operation mode, and wherein the VCC is a first prescribed reference voltage and the Vtp is a second prescribed threshold voltage.

51. The DLL of claim 45, wherein the replica moving switch comprises first and second replica moving switches that couple the replica to an input of a first delay block of the delay block array in accordance with the locking signal before the digital locking operation is performed and couple the replica to an output of the multiplexer after the digital locking operation is performed.

52. The DLL of claim 45, wherein a delay block selected by the enable signals of the multiplexer and antecedent delay blocks receive the first control voltage of a Vtn~VCC level from the analog mode controller.

53. The DLL of claim 45, wherein a delay block selected by the enable signals from the multiplexer receives the first control voltage from the analog mode controller, and a previous delay block receives a fixed second control voltage.

54. The DLL of claim 53, wherein the first control voltage is a range of approximately Vtn~VCC level, and the fixed second control voltage is approximately VCC~Vtp, and wherein the VCC is a first prescribed reference voltage, the Vtn is a first prescribed threshold voltage and the Vtp is a second prescribed threshold voltage.

55. The DLL of claim 45, wherein the delay block array includes a compensation delay unit coupled to an input of a first delay block that has a delay duration equal to the replica.

56. The DLL of claim 55, wherein said compensation delay unit operates as a variable delay unit in accordance with the first control voltage in the analog operation mode, and wherein delay blocks from the first delay block through the selected delay block and the compensation delay unit receive the second control voltage having a range of approximately Vtn~VCC, and wherein the VCC is a first prescribed reference voltage and the Vtn is a first prescribed threshold voltage.

57. The DLL of claim 45, wherein a selected delay block receives the first control voltage in the analog operation mode, and previous delay blocks in the delay block array receive the second control voltage.

58. The DLL of claim 45, wherein the plurality of delay blocks are each a voltage control delay unit that generates a substantially equal delay duration with respect to a control voltage, and said each delay block is formed of a shunt capacitor inverter.

59. The DLL of claim 43, wherein the first and second delay blocks of the delay block array are operated by a DLL enable signal, and the remaining delay blocks are transitioned between an enable mode and a disable mode in accordance with the enable signals, wherein each delay block comprises:
a plurality of inverters that sequentially delay an input clock signal; and
a transistor and a capacitor coupled in series between an output terminal of each of the inverters and a first prescribed reference voltage, wherein the transistor receives a control voltage through its control electrode.

60. The DLL of claim 59, wherein the transistor is a n-type MOS transistor, the capacitor is a FET, and a delay duration of the inverters is determined by a load of the capacitor based on a turning-on operation of the MOS transistor.

61. The DLL of claim 45, wherein said second control voltage is inputted from an initial voltage generator, and the control voltage conversion switch outputs the first and second control voltages to the delay block array in the digital operation mode, and outputs the first control voltage to the delay block array in the analog operation mode.

62. The DLL of claim 61, wherein said first and second control voltages total approximately VCC~Vtp in the digital operation mode, and said first control voltage is a range of approximately Vtn~VCC in the analog operation mode, and wherein the VCC is a first prescribed reference voltage, the Vtn is a first prescribed threshold voltage and the Vtp is a second prescribed threshold voltage.

63. The DLL of claim 45, wherein said multiplexer controller comprises:
a locking point detector that compares the delay clock signals from the delay block array and the first clock signal and detects a locking point;
a latch unit that latches an initial locking point and outputs the locking signal; and
a control signal output unit that samples locking enable signals from the locking point detector in accordance with an output from the latch unit and outputs the control signals.

64. The DLL of claim 63, wherein the locking point detector comprises:
a plurality of flip-flops enabled by a reset signal that samples the delay clock signals at a rising edge of the first clock signal; and
a plurality of logic gates that, output the locking enable signals by sequentially logically processing a non-inverted output of the corresponding flip-flop and inverted output of the next flip-flop.

65. The DLL of claim 63, wherein the latch unit comprises:
first and second NAND-gates that logically processes respective portions of the locking enable signals outputted from the locking point detector;
a NOR-gate that NORs the outputs of the first and second NAND-gates;
a SR latch that latches the output of the NOR-gate in accordance with an inverted reset signal; and
an inverter that inverts the output of the SR latch and outputs the locking signal.

66. The DLL of claim 63, wherein the control signal output unit comprises:
a plurality of flip-flops that invert the locking enable signals from the locking point detector in accordance with the output of the latch unit; and
a plurality of inverters that invert the outputs of the flip-flops and output the plurality of control signals.

67. The DLL of claim 45, wherein the selection signal generator comprises:
a pulse signal generator that receives a subset of the control signals from the multiplexer controller and outputs a plurality of short pulse signals;
a logic operation unit that sequentially logically processes the subset of the control signals outputted from the multiplexer controller and generates a plurality of output signals; and
a selection signal generator unit that generates the plurality of selection signals in accordance with the output signals from the logic operation unit and the pulse signals from the pulse signal generator.

68. The DLL of claim 67, wherein the pulse signal generator does not receive the first control signal among the control signals, and the logic operation unit is a plurality of AND-gate stages in which each stage is formed of a NAND-gate and an inverter, and the output signal of said each stage is an input of the next stage.

69. The DLL of claim 45, wherein said selection signal generator unit includes a plurality of selection signal units that output the plurality of selection signals, wherein a first selection signal unit comprises:

series coupled first and second inverters that invert the first control signal; and a flip-flop that receives the output of the second inverter in accordance with the first clock signal, wherein the remaining selection signal units each comprise,
a SR latch including two NAND-gates,
series coupled third, fourth and fifth inverters that sequentially invert an output of the SR latch, and
a flip-flop that receives an output of the fifth inverter in accordance with a first clock signal.

70. The DLL of claim 45, wherein said multiplexer comprises:

a multiplexer circuit that outputs the locked delay clock signal in accordance with the selection signals from the selection signal generator; and a delay clock array controller that logically computes a subset of the control signals from the multiplexer controller and the DLL enable signal and generates a subset of the delay block enable signals.

71. The DLL of claim 70, wherein said multiplexer comprises:

a plurality of transmission gates having a common output terminal that transmits the plurality of delay clock signals in accordance with the selection signals except for a first delay clock signal; and a NMOS transistor coupled in parallel with the common output terminal, and wherein the delay block array controller is formed of a plurality of AND-gate stages in which each stage is formed in a NAND-gate and an inverter, and the output signal of each stage except a last stage is inputted into the next stage.

72. An analog mixed digital Delay Locked Loop (DLL), comprising:

a digital mode controller that comprises,
a controller,
a control voltage converting switch, and
a delay circuit having a plurality of sequential delay blocks that receives a first clock signal and outputs a plurality of delay clock signals based on the first clock signal, wherein the controller detects a first locking point by comparing phases of the plurality of delay clock signals and the first clock signal, wherein the controller selects one delay clock signal of the plurality of delay clock signals that is locked to the first clock signal at the detected first locking point;

an analog mode controller that compares the phase of the one selected delay clock signal received from the controller and the phase of the first clock signal and outputs a first control voltage to the control voltage converting switch, wherein the control voltage converting switch provides a control voltage to the delay blocks in a digital operation mode and an analog operation mode, and wherein when the first locking point is detected, each of the delay blocks sequentially after a delay block that outputs the one selected delay clock signal are turned off responsive to a control signal from the controller.

73. The DLL of claim 72, wherein the control voltage converting switch selectively provides the first control voltage as the control voltage to the delay blocks in the digital operation mode and a second control voltage as the control voltage to the delay blocks in the analog operation mode.

74. An analog mixed digital Delay Locked Loop (DLL), comprising:

a digital mode controller that comprises,
a controller,
a control voltage converting switch, and
a delay circuit having a plurality of sequential delay blocks that receives a first clock signal and outputs a plurality of delay clock signals based on the first clock signal, wherein the controller detects a first locking point by comparing phases of the plurality of delay clock signals and the first clock signal, wherein the controller selects one delay clock signal of the plurality of delay clock signals that is locked to the first clock signal at the detected first locking point, and wherein the controller outputs a first control signal for the delay blocks; and an analog mode controller that compares the phase of the one selected delay clock signal received from the controller and the phase of the first clock signal and outputs a first control voltage to the control voltage converting switch, wherein the control voltage converting switch provides a control voltage to the delay blocks in a digital operation mode and an analog operation mode, and wherein the analog mode controller comprises,
a delay unit that generates a first enable signal and generates a second enable signal according to a locking signal that indicates completion of the digital operation mode,
a phase detector operated by the second enable signal from the delay unit that generates the first and second pulse signals by detecting a phase difference between the first clock signal and the one selected delay clock signal, and
a charge pump operated by the first enable signal that outputs a first voltage in the digital operation mode, and outputs a second voltage in accordance with the first and second pulse signals received from the phase detector in the analog operation mode, and wherein the first control voltage is output in accordance with the first and second voltages outputted from the charge pump.

* * * * *